(12) United States Patent
Pollentier

(10) Patent No.: US 7,528,387 B2
(45) Date of Patent: May 5, 2009

(54) METHODS AND SYSTEMS FOR CHARACTERISING AND OPTIMISING IMMERSION LITHOGRAPHIC PROCESSING

(75) Inventor: Ivan Pollentier, Langdorp (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 399 days.

(21) Appl. No.: 11/322,090

(22) Filed: Dec. 29, 2005

(65) Prior Publication Data

US 2007/0152170 A1  Jul. 5, 2007

(51) Int. Cl.
*A61N 5/00* (2006.01)
(52) U.S. Cl. .............................. 250/492.2; 250/492.1
(58) Field of Classification Search .... 250/492.1–492.3
See application file for complete search history.

(56) References Cited

U.S. PATENT DOCUMENTS 7,113,256 B2 * 9/2006 Butler et al. ................. 355/53
7,262,422 B2 * 8/2007 Subramanian et al. ... 250/492.2
7,268,357 B2 * 9/2007 Lin et al. ............... 250/492.22
7,315,033 B1 * 1/2008 Pawloski et al. ......... 250/492.2
2005/0051739 A1 * 3/2005 Van Der Net et al. .... 250/492.1
2006/0289794 A1 * 12/2006 Furukawa et al. ........ 250/492.1

* cited by examiner

*Primary Examiner*—Jack I Berman
*Assistant Examiner*—Andrew Smyth
(74) *Attorney, Agent, or Firm*—McDonnell Boehnen Hulbert & Berghoff LLP

(57) ABSTRACT

A method is provided for characterizing an immersion lithography process of a device using an immersion liquid. In order to study pre-soak and post-soak effects on the image performance of an immersion lithography process, the method includes determining at least one image performance characteristic as function of contact times between the immersion liquid and the device for a device illuminated in a dry lithography process and contacted with said immersion liquid prior and/or after said illumination. Based on the image performance characteristic, a lithography process characteristic is derived for the immersion lithography process.

16 Claims, 15 Drawing Sheets

METHODS AND SYSTEMS FOR CHARACTERISING AND OPTIMISING IMMERSION LITHOGRAPHIC PROCESSING

TECHNICAL FIELD OF THE INVENTION

The present invention relates to the field of lithography processing of devices, e.g. in semiconductor processing. More particularly, the present invention relates to methods and devices for characterising and optimising lithographic processing.

BACKGROUND OF THE INVENTION

In the production of today's integrated circuits, optical lithography is one of the key manufacturing techniques. In order to cope with the ongoing miniaturisation of integrated circuits or other devices and its associated problems, low $k_1$ solutions, i.e. solutions allowing high resolving power lithography, are often applied.

Control of critical dimension (CD) and of the resist profile is increasingly important in low-$k_1$ lithography in order to guarantee the imaging quality for these solutions. This control is even more difficult in thin resist lithographic processing due to chemical interactions occurring at the resist surfaces. The critical dimension and resist profile control typically are affected significantly by chemical interactions with the top surface of the device and possibly with underlying layers of the device such as an anti-reflective coating. These chemical interactions may result in contamination, e.g. airborne contamination.

Implementation of immersion lithography further lays a burden on critical dimension and resist profile control since more sources of chemical interaction can play a role. For example, leaching of photo-active material from the resist into the immersion liquid, or diffusion of the immersion liquid into the resist may occur. One solution to prevent possible contamination by the immersion liquid is the use of a top coat. Nevertheless, whether a top coat is used or not, it is expected that critical dimension control and profile control in immersion lithography will be susceptible to more variations compared to dry lithography.

SUMMARY OF THE INVENTION

It is an object of the present invention to provide good apparatus and methods for characterising and/or optimising immersion lithographic processing, e.g. of a device. It is an advantage of embodiments of the present invention that systems and methods are provided for characterising the influence of soak time on the critical dimension (CD) control and/or resist profile control. It is also an advantage of embodiments of the present invention that good apparatus or methods for immersion lithographic processing of devices are provided, based on a characterisation of the influence of soak time on the critical dimension (CD) control and/or resist profile control.

The above objective is accomplished by a method and device according to the present invention.

The present invention relates to a method for characterising immersion lithographic processing of a device using an immersion liquid, the immersion lithographic processing comprising exposing said device to an immersion liquid, the method comprising: determining at least one image performance characteristic as function of contact times between said immersion liquid and a device for a device illuminated in a dry lithographic process and contacted with said immersion liquid prior and/or after said illumination, and deriving a lithography process characteristic for said immersion lithographic processing based on said at least one determined image performance characteristic. Said deriving may be automated deriving, e.g. performed by a suitably programmed processor such as a microprocessor. Said determining may be automated determining, e.g. performed by a suitably programmed processor such as a microprocessor and/or a measurement system. The illumination in a dry lithography process may have the same illumination settings as used in the immersion lithography process under study, e.g. at least the same illumination wavelength as used in the immersion lithography process under study. Preferably, the dry lithography process has the same non-immersion related settings as the immersion lithography process. It is an advantage of embodiments of the present invention that an immersion lithography process can be mimicked by a separate illumination step in a dry lithography process and by a separate contacting step for contacting the device with the corresponding immersion liquid, allowing a high degree of control of the different parameters and resulting in an efficient way for characterising an immersion lithography process. Determining at least one image performance characteristic may comprise determining a dimensional variation characteristic of an imaged structure or an image of a structure, e.g. for a structure to be imaged on the device.

Determining at least one image performance characteristic for the device contacted with said immersion liquid may comprise determining at least one image performance characteristic as function of contact times for a device contacted with said immersion liquid by dispensing said immersion liquid over said device in an at least partially radial dispensing or spreading movement for providing a varying contact time between said immersion liquid and said device varying radially over said device. The radial movement may be outwards from a central point or inwards towards a central point. It is an advantage that an effective and controllable way of providing different contact times to a device is obtained by embodiments according to the present invention. The device may be spun during said dispensing, thus creating centrifugal forces that systematically remove said immersion liquid from said device. It is an advantage of embodiments of the present invention that systematic removal of the immersion liquid from the device further may allow obtaining controllable contact times.

An at least partially radial dispensing movement may be an inwardly at least partially radial dispensing movement. In other words, the dispensing may be performed from substantially the edge of the device to substantially the centre of the device. The latter may allow to obtain very short contact times corresponding with the contact times in an immersion lithography process, i.e. in the same range of contact times as for an immersion lithography process.

Said determining at least one image performance characteristic as a function of contact times may comprise determining an image parameter for a printed structure of said device, printed during said illumination in said dry lithography process. An image performance characteristic may be a parameter related to the obtainable critical dimension of printed structures or a parameter related to the resist profile.

The printed structure may be printed on at least a radial part of said device, whereby said determining an image parameter for a printed structure may comprise determining said image parameter for a printed structure at different radial positions of said device.

It is an advantage of embodiments of the present invention that a temporal variation in contact time can be translated into a spatial variation of a characteristic on the device. The latter can allow study of different contact times by studying a single device, thus making it an efficient method for studying different contact times.

Determining at least one image performance characteristic for a device contacted with said immersion liquid prior and/or after said illumination, may comprise determining a first image performance characteristic as a function of first contact times for a device contacted with said immersion liquid prior to said illumination and determining a second image performance characteristic as a function of second contact times for a device contacted with said immersion liquid after said illumination.

The latter can allow study of effects of both a pre-soak and a post-soak occurring in an immersion lithography process, whereby both pre-soak and post-soak parameters can be controlled. In this way the soaking effects in an immersion lithography process can be mimicked in a realistic way.

The method furthermore may comprise determining first exposure time periods during which, for an immersion lithography process, said device is exposed to said immersion liquid before illumination and determining second exposure time periods during which, for an immersion lithography process, said device is exposed to said immersion liquid after illumination, wherein deriving a lithography process characteristic for said immersion lithography process may comprise determining an image performance characteristic of said immersion lithography process based on correlating said first and second exposure time periods to said first and second image performance characteristics. This determining step for determining first exposure time periods may be an automated determining step, e.g. performed by a suitably programmed processor such as a microprocessor.

Deriving said lithography process characteristic may comprise deriving whether an obtained image for said immersion lithography process is allowable or not. Deriving whether an obtained image for said immersion lithography process is allowable or not may e.g. comprise evaluating an image parameter with respect to a predetermined reference image parameter value defining a limit for an allowable image for an immersion lithography process.

One aspect of the present invention relates to a method for characterising an immersion lithographic processing of a device using an immersion liquid, the immersion lithographic processing comprising exposing said device to an immersion liquid, the method comprising illuminating said device in a dry lithography process, and contacting said device with said immersion liquid prior and/or after said illuminating, said contacting a device with said immersion liquid being by dispensing said immersion liquid over said device in an at least partially radial dispensing movement for providing a varying contact time between said immersion liquid and said device varying radially over said device.

Another aspect of the present invention relates to a method, e.g. automated method, for characterising an immersion lithographic processing of a device using an immersion liquid, the immersion lithographic processing comprising exposing said device to an immersion liquid, the method comprising receiving at least one image performance characteristic as function of contact times between said immersion liquid and a device for a device illuminated in a dry lithography process and contacted with said immersion liquid prior and/or after said illumination, and automated deriving of a lithography process characteristic for said immersion lithography process based on said at least one received image performance characteristic.

Another aspect of the present invention relates to a method for immersion lithographic processing of a device, the method comprising contacting said device with an immersion liquid, wherein the influence of contacting the device with an immersion liquid on the immersion lithography process has been characterised using a method for characterising an immersion lithography process of a device using an immersion liquid as described above. The latter may comprise determining at least one image performance characteristic as function of contact times between said immersion liquid and a device for a device illuminated in a dry lithography process and contacted with said immersion liquid prior and/or after said illumination, and deriving a lithography process characteristic for said immersion lithography process based on said at least one determined image performance characteristic.

Another aspect of the present invention relates to an apparatus for use in a method for characterising an immersion lithographic processing of a device, the apparatus being adapted for controllably contacting a device with immersion liquid, the apparatus comprising means for dispensing adapted for dispensing said immersion liquid over said device in an at least partially radial movement with a controlled radial velocity. The apparatus may include means for rotating the device. The at least partially radial movement may be an inwardly radial movement, i.e. from the edge of the device to the centre of the device.

Another aspect of the present invention relates to a computing system, the system comprising a means for receiving values for at least one image performance characteristic as function of contact times between said immersion liquid and a device for a device illuminated in a dry lithography process and contacted with said immersion liquid prior and/or after said illumination, and a means for deriving a lithography process characteristic for said immersion lithography process based on said values for an image performance characteristic.

Another aspect of the present invention relates to a computer program product for executing a method for characterising an immersion lithographic processing of a device as described above. The computer program thus may be adapted for executing a method comprising determining at least one image performance characteristic as function of contact times between said immersion liquid and a device for a device illuminated in a dry lithography process and contacted with said immersion liquid prior and/or after said illumination, and deriving a lithography process characteristic for said immersion lithography process based on said at least one determined image performance characteristic.

Another aspect of the present invention relates to a machine readable data storage device storing such a computer program product and/or to the transmission of such a computer program product over a local or wide area telecommunications network. It is an advantage of embodiments of the present invention that by using a radial soak of a device, the soak time dependency of image performance characteristics can be quantified in an efficient way.

It is an advantage of certain embodiments of the present invention that the impact of immersion scanner soaks on the imaging characteristics can be determined and possibly be reduced. The imaging characteristics may be resist profile control and/or critical dimension control.

It is an advantage of certain embodiments of the present invention that the methods for determining the time dependency of the structural variation induced by immersion lithography of a photosensitive layer combination can be used to evaluate the sensitivity of a given immersion lithography process with a given resist. The method may provide a GO/NO GO criterion for accepting the process for use in production. In some embodiments of the present invention, the method for characterising an immersion lithographic processing of a device may be used for analysing the leaching of the resist and/or the diffusion of water in the film.

Particular and preferred aspects of the invention are set out in the accompanying independent and dependent claims. Features from the dependent claims may be combined with features of the independent claims and with features of other dependent claims as appropriate and not merely as explicitly set out in the claims.

The teachings of the present invention permit the design of improved methods and apparatus for lithographic processing systems and lithographic processing methods, e.g. in more efficient, stable and reliable methods and apparatus for lithographic processing systems and lithographic processing methods.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
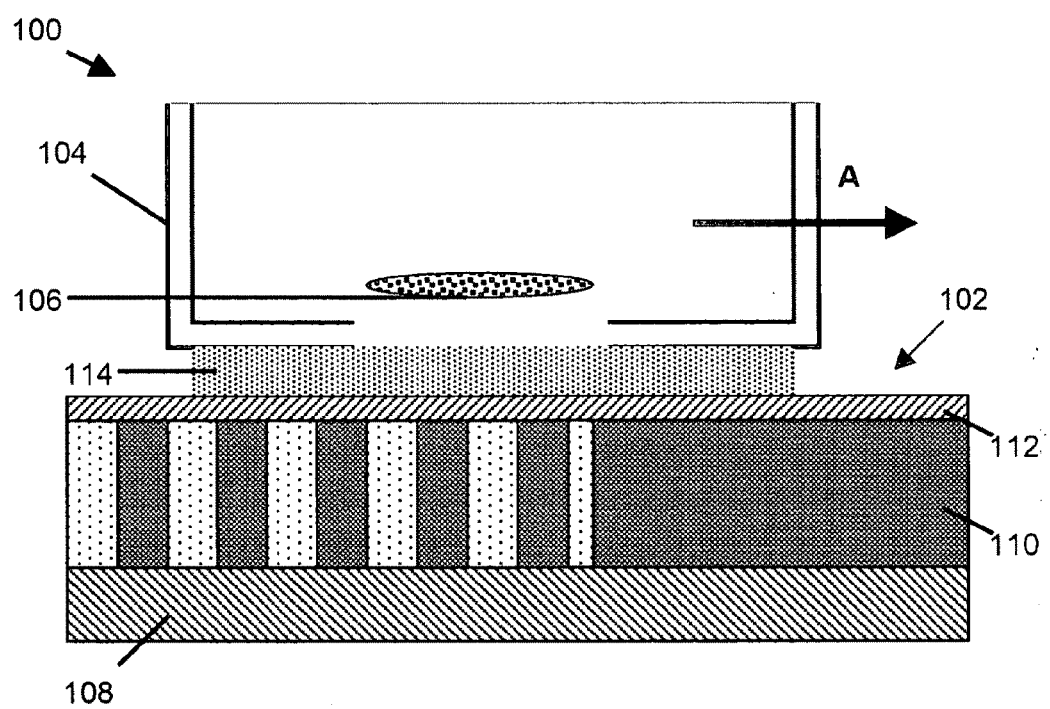
FIG. 1 is a schematic representation of an illumination step during lithographic processing using an immersion lithography system, according to prior art.

In the different figures, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

The following terms are provided solely to aid in the understanding of the invention. These definitions should not be construed to have a scope less than understood by a person of ordinary skill in the art. With immersion lithography or immersion lithographic processing there is meant lithographic processing wherein an immersion liquid is used in between the device to be processed and a final element of the imaging system used for lithographic processing. The use of an immersion liquid allows capture of more light rays, compared with the situation where air is present between the final element of the imaging system and the device. In the present application, with dry lithography or dry lithographic processing, there is meant lithographic processing wherein no immersion liquid is present between the final element of the imaging system and the device, where typically air is present between the final element of the imaging system and the device. Typically in today's immersion lithography, the immersion liquid typically used is water, although the invention is not limited thereto.

The critical dimension (CD) typically is defined as the smallest width of a line or the smallest space between two lines that can be allowed in the manufacturing of a device for a given lithography process.

In the present invention, the term pre-exposure soak, also referred to as pre-soak will be used for referring to a contact between the immersion liquid and the device prior to illumination of the device. The term post-exposure soak, also referred to as post-soak will be used for referring to a contact between the immersion liquid and the device after the illumination of the device. By way of illustration, FIG. 1 shows the possibility for pre-soak and post-soak occurrence possibilities in part of an immersion lithographic set-up 100. FIG. 1 illustrates a schematic representation of part of an immersion lithographic set-up 100 for immersion lithographic processing of a device 102. The immersion lithographic set-up 100 typically comprises an immersion showerhead 104 and a final lens element 106 of the imaging system. The device 102 typically comprises a substrate 108 with a resist layer 110 and possibly a top coating layer 112. Between the device 102 and the immersion showerhead 104 typically an immersion liquid 114 is present. In FIG. 1 an immersion showerhead 104 moving relatively to the right with respect to the device 102 is shown. A region is shown wherein contact between the immersion liquid 114 and the device 102 occurs before illumination, e.g. a region with pre-soak, and a region is shown wherein contact between the immersion liquid 114 and the device 102 occurs after illumination of the device 102, e.g. a region with post-soak. In practice, during immersion lithographic processing, the contact of the immersion liquid 114 with the device 102, which can be referred to as a soak, typically is not uniform over the device, since the immersion liquid is locally kept in a small region, by the showerhead 104. During exposure of the device 102, the showerhead 104 is continuously in relative movement with the device 102, resulting in possible interaction time differences for different locations on the device 102. This relative movement is indicated in FIG. 1 by arrow A. The corresponding contact times, also referred to as pre-soak time and post-soak time, typically may vary between different places on a device e.g. due to the path of the immersion hood followed. Therefore, these may be referred to as local contact times. Furthermore, the showerhead 104 area typically is larger than the exposed field area, determined by the slit of the lens 106. The latter implies that the device 102 will always be subject to a pre-soak. During this pre-soak, specific chemical interactions can occur, e.g. leaching of photo active compounds and quencher and/or diffusion of immersion liquid 114 or immersion liquid components in the resist layer 110. A top coating layer 112 should be a barrier for this behaviour, but some molecules may still be able to diffuse through the top coating layer 112. During exposure, the photochemical reaction generates new products in the resist layer 110, made of photoresist material, which in turn can diffuse or react with the immersion liquid 114. After exposure, a considerable soak, e.g. post-soak, may occur as the immersion showerhead 104 is larger than the exposure field. During post-soak e.g. chemical interaction may occur with the acid generated after exposure. Furthermore soak also may occur when e.g. neighbouring dies are exposed. These considerations, illustrated in FIG. 1, suggest that a lot of variables are involved, which all could lead to changes in image performance characteristics, such as resist profile changes and/or CD-variations. Moreover, the chemical interaction mechanism can be very complex and material specific, so it can be hard to predict quantitatively how much impact the soak will have towards CD-control, during printing on an immersion scanner.

Figure 2:
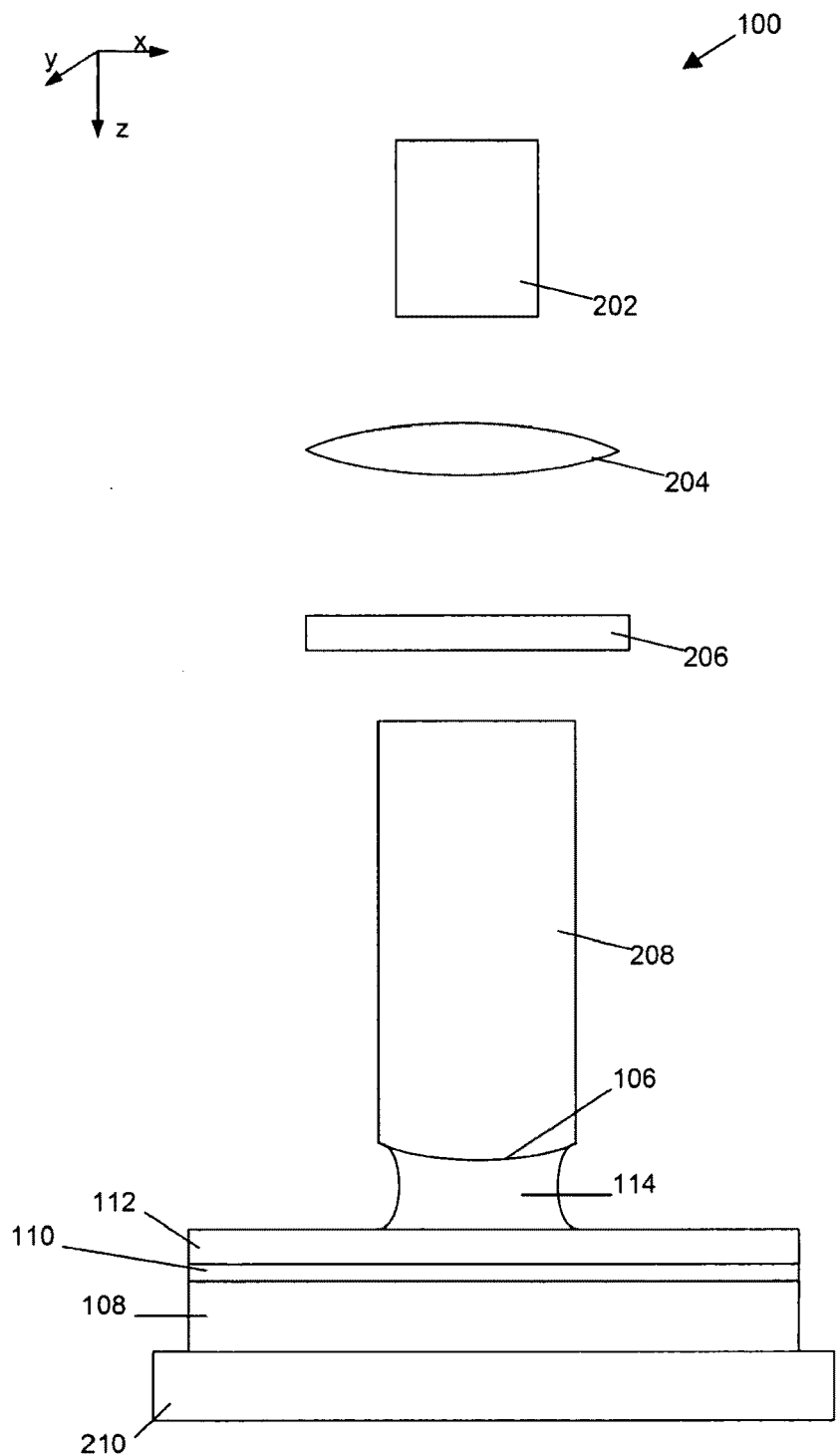
FIG. 2 is a schematic representation of an immersion lithographic system, according to prior art.

The embodiments of the present invention typically may be related to an immersion lithographic processing system. The method is applicable to lithographic processing which can be performed on any type of immersion lithographic set-up, such as but not limited to the set-up shown in FIG. 2, shown by way of illustration only. An optical lithographic system with a transmission set-up is shown, although the invention is not limited thereto and is e.g. also applicable to a system with a reflection set-up. It may be e.g. an immersion lithographic stepper system or an immersion lithographic scanner system. The optical immersion lithographic system 100 typically comprises a source of electromagnetic radiation, e.g. a light source 202. The light from the light source 202 typically is transmitted through an optical system 204 comprising a lens and is incident on a mask 206. The mask 206 contains information about the image to be generated in a resist layer and is basically defined thereby. Typically the mask 206 may be part of a set of masks used for creating a device or circuit using lithography. Different types of masks exist; such as e.g. an alternated phase shift mask, an attenuated phase shift mask, a binary mask, etc. The light, carrying the mask information, is then passed through an imaging module 208, which e.g. may have a final lens surface 106, and thus is guided to a resist layer 110 on a substrate 108. The optics of the imaging module 208 inherently defines the numerical aperture (N.A.) of the imaging module 208. The device 102 typically is mounted on a substrate stage 210. Typically an immersion showerhead 104 provides an immersion liquid 114 between the resist layer 110 and the output of the imaging module 208, e.g. the final lens surface 106, in order to allow increase of the numerical aperture of the system 100. A typical immersion liquid 118 used is water. Other optional and/or additional components are not illustrated in FIG. 2.

In a first embodiment, the present invention relates to a method and system for characterising an immersion lithography process of a device. Typically in immersion lithographic processing the device 102 is exposed to immersion liquid 114. As described above, contact between immersion liquid 114 and a device 102 to be processed, i.e. a soak of the device 102 to be processed, may influence imaging process characteristics, such as e.g. resist profile control or critical dimensions of imaged structures or the overall quality of the image produced. Nevertheless, characterising the impact of such a contact on the immersion lithographic processing characteristics, e.g. due to particular chemical interactions occurring during the soak, is not straightforward on an immersion scanner, since printing features on such a tool will always combine pre- and post-soak together, and each of them will have their specific chemical interactions. In the first embodiment, soak effects in an immersion lithography process are mimicked by taking into account a separate contacting step between the immersion liquid 114 and the device 102 and a separate illumination step. The separate illumination step thereby typically is performed in a dry lithographic system, i.e. a lithographic system not based on the use of immersion lithography, such that during the illumination step no additional contact between the immersion liquid 114 and the device 102 occurs. In other words, the immersion lithography process is mimicked or a virtual immersion lithography process is performed. The dry immersion lithography is preferably performed using the same illumination conditions, preferably using at least the same illumination wavelength as for the immersion lithography. Preferably, the dry lithography processing is performed with the same conditions as the immersion lithography processing, except for the immersion-related conditions.

Figure 3:
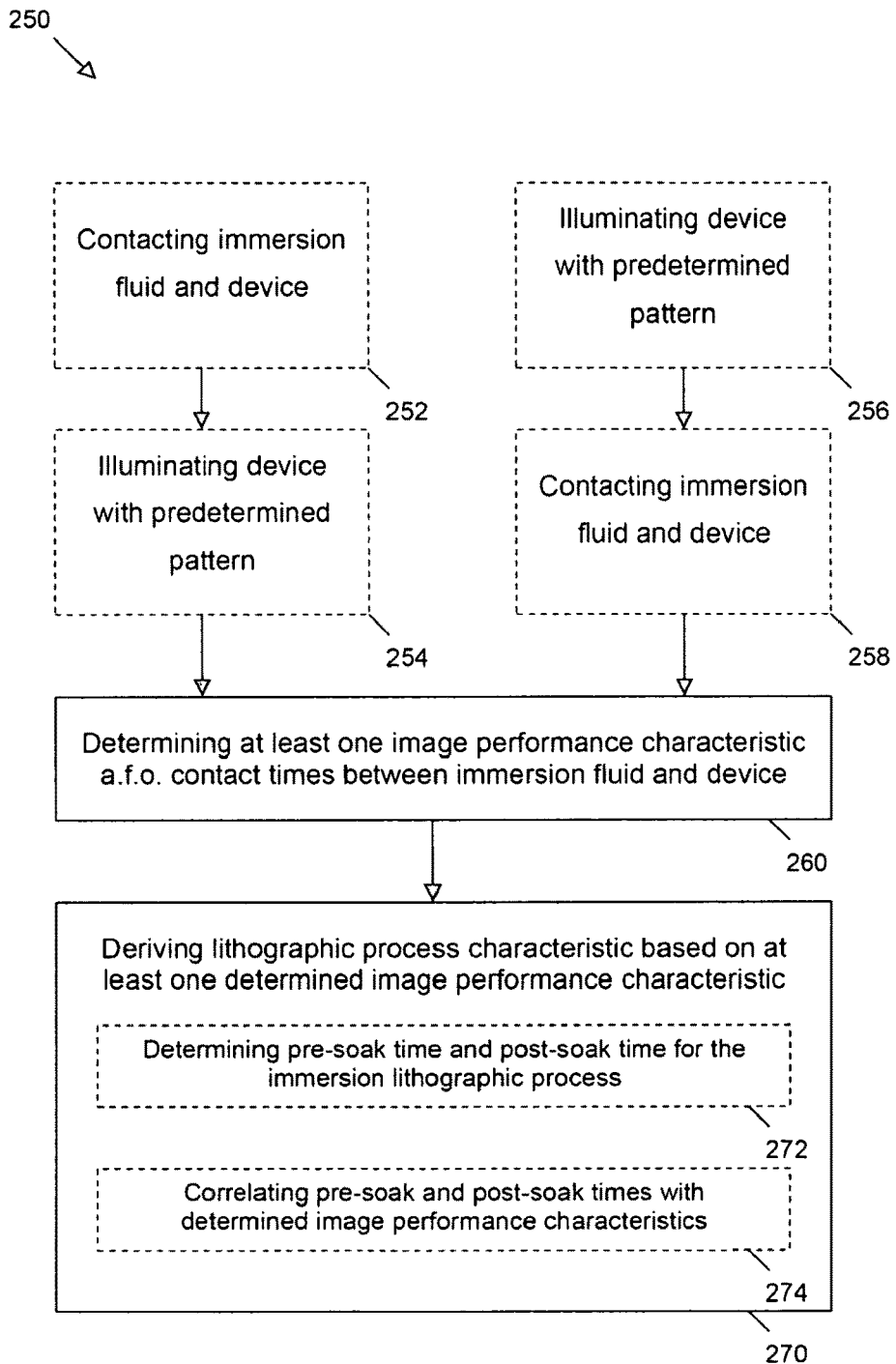
FIG. 3 is a flow diagram of an example method for characterising an immersion lithographic process according to the first embodiment of the present invention.

The method 250 of the present invention, illustrated in FIG. 3, comprises the step 260 of determining at least one image performance characteristic as function of contact times between the immersion liquid typically used in the immersion lithography system that is to be characterised and the device. Such determination is performed on a device that is illuminated in a dry lithography process and that is contacted with the immersion liquid prior and/or after the illumination step. The latter implies that the contact or soak may be performed prior to the illumination step, such that a pre-soak is mimicked and/or may be performed after the illumination step, such that a post-soak is mimicked. Determining at least one image performance characteristic for a device may comprise determining a first image performance as function of contact time for a device contacted with said immersion liquid prior to said illumination and/or determining a second image performance characteristic as a function of second contact times for a device contacted with said immersion liquid after said illumination. When both image performance characteristics due to pre-soak and post-soak are determined, both the pre-soak and post-soak effects in an immersion lithographic processing can be characterised. Different contacting methods could be applied, as long as they allow to provide a time-controllable contact between the immersion liquid 114 and the device 102, preferably in the same range as for contact times between the immersion liquid 114 and the device 102 during immersion lithographic processing of a device. The illumination using the dry lithography process may be an illumination using the same illumination settings as used in the immersion lithography process, for example, having the same exposure dose, using the same wavelength, using the same coherence factor, etc. Such an illumination step typically comprises imaging a pattern on the device 102. The method is not limited by the specific pattern used, as long as the pattern allows determination of an accurate image performance characteristic for said virtual immersion lithography process. Determining at least one image performance characteristic typically may comprise determining a parameter related to the critical dimension (CD) or resist profile for a structure imaged in the illumination step, although other parameters also may be used. In order to determine at least one image performance characteristic typical resist processing steps also may be performed. Such resist processing steps may for example comprise a post exposure bake and a resist developing step. Determining at least one image performance characteristic as function of contact times may comprise determining an image parameter for a printed structure of said device, printed during the illumination in the dry lithography process. Determining at least one image performance characteristic may e.g. be performed using scatterometry, CD-scanning electron microscopy, cross-section SEM, etc. Determining at least one image performance characteristic may for example be performed using a scatterometry measurement device such as a KLA-Tencor F5 device as available from KLA-Tencor Corporation or a TEL iODP device as available from Tokyo Electron Limited. It is to be noticed that in the first embodiment of the present invention, the illumination and contacting step, i.e. the processing steps in the virtual immersion lithographic processing, may be but do not need to be part of the method, whereas determining image performance characteristics on a device obtained by performing the processing steps in the virtual immersion lithographic processing is part of the present invention. The latter is illustrated in FIG. 3, by providing a combination of a first contacting step 252 and a first illumination step 254 to mimic the pre-soak and a combination of a second contacting step 256 and a second illumination step 258 to mimic the post-soak as optional steps. Also devices wherein a pre-soak, an illumination and a post-soak is performed may be used as input for step 260. Determining at least one image performance characteristic may also comprise correcting for image performance characteristic influences caused by other, e.g. additional processing steps wherein no soak occurs. The latter may e.g. be done by applying a similar determination to a reference device, such as an illuminated but non-soaked or soak-free device, and correcting the obtained results for the soaked device therewith. Additional steps that may influence the image performance characteristic may e.g. be a post-exposure bake (PEB) or resist development process.

The method of the present embodiment furthermore comprises deriving 270 a lithography process characteristic for the immersion lithography process based on the at least one determined image performance characteristic. Deriving the lithography process characteristic may comprise using the at least one image performance characteristic as obtained in the virtual immersion process, e.g. the at least one image performance characteristic as obtained in the process with separate contacting step and illumination step, or a scaled version thereof as a lithography process characteristic. Deriving the lithography process characteristic also may comprise using look-up tables, reference values or experimental or theoretical models for converting the obtained at least one image performance characteristic as obtained in the virtual immersion process to a lithography process characteristic. In one embodiment, deriving a lithography process characteristic for the immersion lithography process may comprise an explicit conversion from the at least one determined image performance characteristics. Such a conversion may be based on determination of a pre-soak time and a post-soak time during which the device is pre-soaked respectively post-soaked in the immersion lithography process, shown as optional sub-step 272 of the deriving step 270. The determined pre-soak time and post-soak time then may be correlated to image performance effects as function of contact time for the virtual immersion set-up obtained for pre-soak and to image performance effects as function of contact time for the virtual immersion set-up obtained for post-soak, shown as optional sub-step 274 of the deriving step 270. Deriving a lithography process characteristic also may comprise evaluating whether obtained image characteristics for said immersion lithography process would be allowable or not. The latter may e.g. comprise evaluating image parameters with respect to a pre-determined reference image parameter value defining a limit for allowable image quality for an immersion lithography process. Such deriving may be performed in an automated and/or automatic way. It may be performed based on mathematical models, predetermined algorithms, neural networks, etc.

Figure 4:
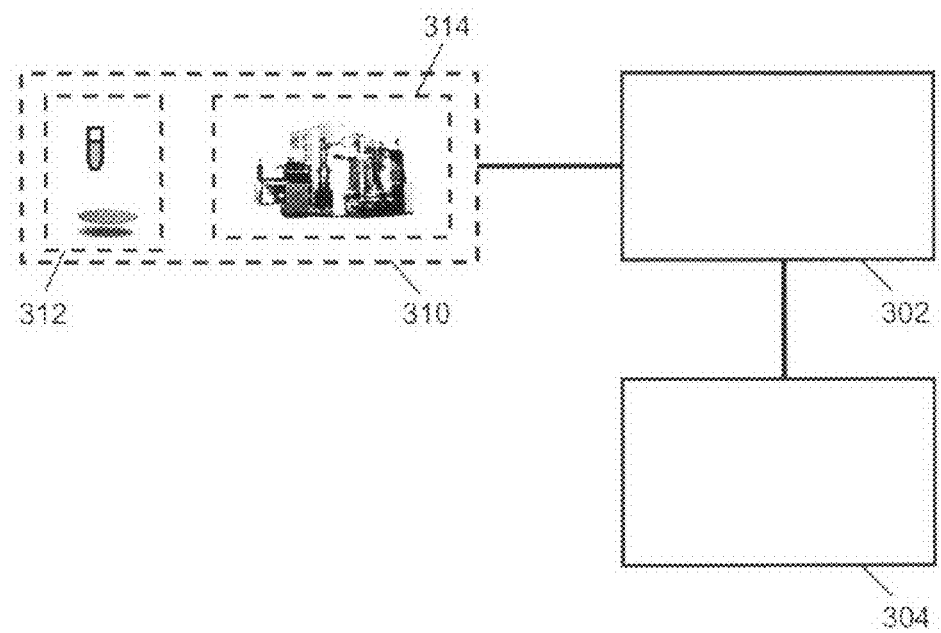
FIG. 4 is a schematic representation of a system that can be used for performing a method for characterising an immersion lithographic process according to the first embodiment of the present invention.

The present invention also relates to a system for performing such a method for characterising an immersion lithography process of a device. A schematic representation of such a system is shown in FIG. 4. Such a system 300 typically comprises a measurement means 302 for determining at least one image performance characteristic as function of the contact times between immersion liquid and a device for a device illuminated in a dry lithography process and contacted with the immersion liquid prior and/or after said illumination. Such a system typically may comprise an image performance characteristic analysis system, such as for example a system for scatterometry or for CD-SEM. Typical systems that may be used for scatterometry are e.g. a KLA-Tencor F5 scatterometry system as available from KLA-Tencor Corporation or a TEL iODP scatterometry system as available from TEL Corporation. Preferably a system for CD-metrology is used with very high precision and with the possibility to give two-dimensional information about the resist profile. The system 300 furthermore comprises a processing means 304 for deriving a lithography process characteristic based on the at least one determined image performance characteristic. Such a processing means 304 may be a standard processing means. The system furthermore optionally may comprise a virtual immersion set-up 310 for mimicking an immersion lithography process, which typically comprises a contacting means 312 for providing contact between an immersion liquid 114 and the device 102 and a dry lithographic system 314, for providing illumination of the device 102 according to a predetermined pattern. When both a pre-soak and a post-soak is performed, the contacting means 312 may be used twice or a second contacting means 312 may be provided. Such a dry lithographic system may e.g. be an ASML PAS5500/1100 system for dry 193 nm exposure, the invention not being limited thereto, depending on the immersion lithography process to be characterised. Other apparatus for providing resist coatings and for performing further resist processing steps also may be part of the system (not shown in FIG. 4). The over-all lithographic system used for patterning can be considered as a virtual immersion tool. Compared to 'real' immersion, this set-up has the advantage that the pre- and/or post-soak can be controlled independently, so the impact of each interaction can be characterized separately.

It is an advantage of embodiments according to the present invention that a decomposition of the pre-soak and post-soak can be performed such that soaking effects on the lithographic performance characteristics can be characterised well, while the immersion lithography process still can be mimicked appropriately. The methodology quantifies experimentally how much variation on the image performance, e.g. resist profile change and/or CD-variation, is caused by a particular pre- and post-soak time. This is done by testing the process in a virtual immersion set-up and measuring the image performance variation. In this way it is possible to evaluate image performance variations related to immersion soak.

In a second embodiment, the present invention also relates to a method for characterising an immersion lithography process of a device according to the first embodiment, but an advantageous method for contacting the immersion liquid 114 with the device 102 is described. In the present embodiment, the method step of determining at least one image performance characteristic thus is performed for a device that has been contacted according to the description provided further in this embodiment and the optional contacting step, if part of the method, is adapted according to the description provided further in this embodiment. Determining at least one image performance characteristic as function of contact time then may be performed in an efficient way. The other steps typically may be similar to those of the method described in the first embodiment. The contact times between the immersion liquid and the device typically present in the immersion lithography process to be characterised typically are short, i.e. in the order of one second or even less. The method of the present embodiment typically uses a specific way of contacting the device 102 and the immersion liquid 114, allowing to study these short contacting times. The latter is obtained by dispensing the immersion liquid on the device 102 in an at least partially radial dispensing movement. In other words, the immersion liquid 114 is dispensed during a relative radial movement of the immersion liquid source. As described in the first embodiment, the step of contacting immersion liquid 114 and a device 102 may be performed more than once, e.g. to study effects separately from pre-soak and post-soak, to study the combination of a given pre-soak and post-soak, etc. A more detailed description of a preferred contacting step and the corresponding method step for determining at least one image performance characteristic will be described below.

Figure 5:
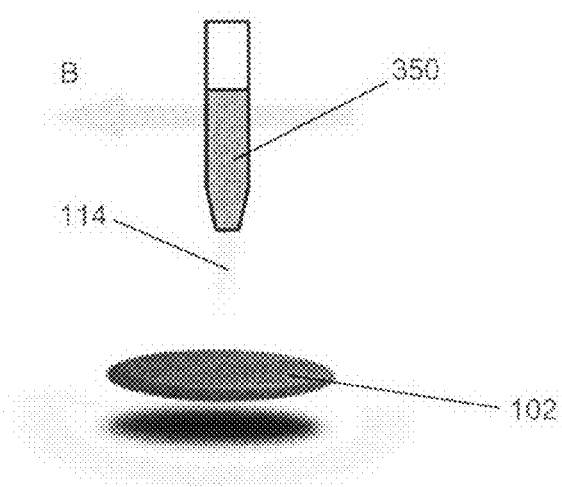
FIG. 5 is a schematic representation of an example contacting system for contacting immersion liquid and a device according to the second embodiment of the present invention.

A device 102 is received for contacting with an immersion liquid 114. Preferably, the device 102 is rotated, i.e. spun. The latter will allow systematic removal of the immersion liquid 114 from the device 102 after it has been contacted, based on centrifugal forces. Typically such spinning is performed around the centre of the device, although the latter is not limited thereto and a slightly different rotation centre also may be used. Immersion liquid 114 is dispensed on the, e.g. rotating, device 102 along a radius of the device 102. The latter may be performed by moving a nozzle dispensing the immersion liquid 114 at least partially in radial direction relative to the device 102. In other words, an at least partially radial movement between the immersion liquid dispensing source 350 and the device 102 is provided or the immersion liquid is dispensed on the device in an at least partially radial dispensing movement, indicated by arrow B. The latter is illustrated schematically in FIG. 5. The immersion liquid 114 arriving at the device 102 will contact the device 102 and typically may move over the device surface to the edge of the device 102, where it is removed by centrifugal forces caused by rotation of the device 102. The latter implies that the immersion liquid 114 typically will contact the device 102 on a path between the initial contact position of the immersion liquid 114 with the device 102 and the edge of the device 102. By providing a dispensing path along the radius of the device, typically positions on the device surface near the edge will be in contact longer with the immersion liquid than positions on the device surface near the centre. In this way a spatial variation, i.e. radial variation, of the contact time between the immersion liquid and the device is obtained over the device 102. In other words, the local contact time varies radially. Preferably, in order to have control about the different contact times along the radius of the device, dispensing may be performed in a controlled movement. The speed by which the dispensing movement is performed typically determines the range of contact times that is obtained. In lithography, typically devices 102 are disc-shaped devices. If the latter is not or not exactly the case, dispensing on the device 102 along a radius of the device 102 is to be interpreted as dispensing immersion liquid on the device along a path between the rotation centre of the device and the edge. Dispensing immersion liquid 114 may be done in an inwardly at least partially radial dispensing movement, i.e. from the edge to the rotation centre, or in an outwardly at least partially radial dispensing movement, i.e. from the rotation centre to the edge. It is an advantage of using an inwardly radial dispensing movement that the immersion liquid may already be dispensed in a controlled way just before reaching the edge of the device 102, i.e. the initial contact point with the device 102, allowing to have a good control of the soak performed. The dispense typically is stopped when the end point of the path is reached. Such a soak step typically may be performed using a device processing system such as e.g. a TEL ACT8 Clean Track whereby a soak can be performed using a rinse nozzle in a development cup, although the invention is not limited thereto. Typically the latter also allows rotation of the device. Alternatively, a more simple device may be used comprising a means for dispensing immersion liquid whereby a relative motion can be performed between the means for dispensing and the device and a device holder, and preferably a means for rotating the device 102. It is an advantage of the contacting method described in the present embodiment that it allows mimicking a controlled soak time variation. It is a further advantage that the controlled soak time variation may be present on a single device.

An alternative method for dispensing the immersion liquid on the device 102 in an at least partially radial dispensing movement may be controlled dipping of the device in a bath of immersion liquid. The device then typically is dipped in the immersion liquid by controllably providing a relative movement between the device and the immersion liquid bath, thus bringing the device into the bath and removing the device from the bath. The speed by which the relative movement is performed will be representative for the contact time at each point of the device. An edge part of the device will contact the immersion liquid from the start and will stay in contact with the immersion liquid for the longest time. The variation of contact time between the device and the immersion liquid will not be radial and rotational symmetric for the device. Preferably for example a path, e.g. radial path, extending parallel with the direction of the relative movement between the device and the bath may be used for studying varying contact times. The device may e.g. be dipped by moving it perpendicular to the surface of the immersion liquid bath.

Based on the above, determining at least one image performance characteristic as function of time typically may comprise determining at least one image performance characteristics at different positions on the radius of the device, i.e. at different radial positions of the device 102. Therefore, the pattern imaged on the device during illumination may be such that it substantially fills the device such that structures are present at least at representative positions between the edge and the centre of the device, i.e. at different radial positions of the device 102. Other features of the determining step may be as described in the first embodiment. It is an advantage of the present embodiment that a temporal variation in contact time between the immersion liquid 114 and the device 102 is translated in a spatial variation of an image performance characteristic on the device 102, allowing to study different contact times on one device 102. The latter leads to an efficient method.

In a third embodiment, the present invention relates to a method for immersion lithographic processing of a device. The method typically comprises contacting the device with an immersion liquid prior, during and after imaging of a pattern on the device. The method comprises the typical processing steps as performed in prior art methods for immersion lithographic processing, but has the additional step that the influence of the contacting between the device and the immersion liquid are characterised using a method for characterising as described in any of embodiments 1 and 2. The influence of the contacting between the device and the immersion liquid thus typically is characterised by determining at least one image performance characteristic as function of contact times between said immersion liquid and a device for a device illuminated in a dry lithography process and contacted with the immersion liquid prior and/or after the illumination, and deriving based thereon a lithography process characteristic. The latter can be taken into account for interpreting or evaluating the results obtained with the immersion lithographic processing of the device.

In a fourth embodiment, the present invention relates to an apparatus for controllably contacting a device with an immersion liquid that can be used in a method for characterising immersion lithographic processing using a virtual immersion lithography process as described above. Such an apparatus thus may be used in a set-up as shown in FIG. 4, e.g. as the contacting means 312. The apparatus for controllably contacting a device according to the present embodiment typically comprises a means for rotating a device and a means for dispensing that is adapted for dispensing the immersion liquid over the device in an at least partially radial dispensing movement with a controllable radial velocity. The at least partially radial dispensing movement may be an at least partially inwardly radial dispensing movement, i.e. wherein the dispensing movement is from the edge of the substrate towards the centre of the substrate. The means for rotating may allow rotating the device up to a few hundred times per minute, e.g. up to 500 rpm. Such system may be a typical device cleaning system used in semiconductor processing, whereby the system is controlled to provide a radial dispensing movement with a controllable radial velocity. The system therefore may comprise a controller, such as e.g. a dedicated controller. Furthermore, the flow rate of the immersion liquid also may be controlled.

Figure 6:
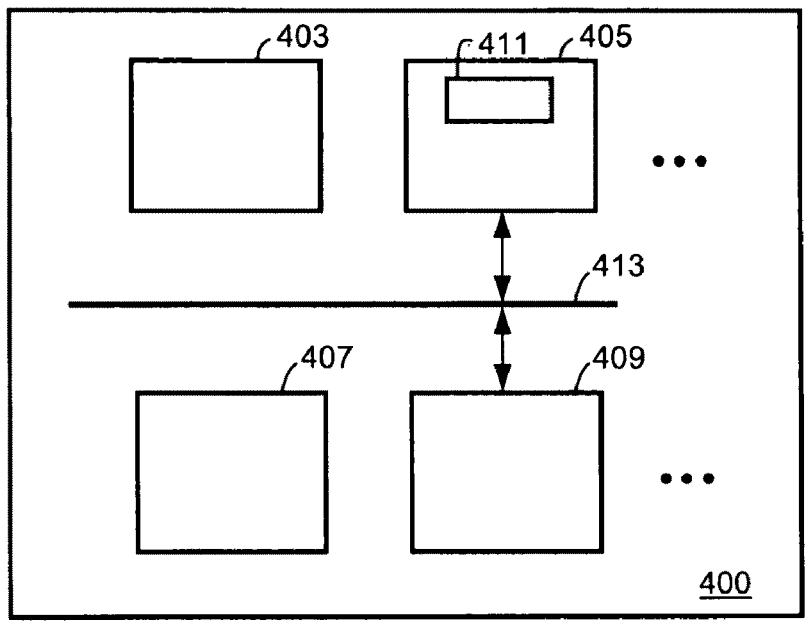
FIG. 6 is a schematic representation of a computing system that may be used for performing methods for characterising immersion lithographic processing, according to a fifth embodiment of the present invention.

In a fifth embodiment, the present invention relates to a processing system wherein the method embodiments according to the present invention are implemented. In other words, it relates to a processing system adapted for performing a method for characterising immersion lithographic processing of a device according to the present invention, comprising determining at least one image performance characteristic as function of contact times between an immersion liquid and a device, for a device illuminated in a dry lithography process and contacted with the immersion liquid prior and/or after the illumination and deriving based on the at least one determined image performance characteristic a lithography process characteristic for the immersion lithography process under study. Such a system may comprise a means for receiving values for at least one image performance characteristic as function of contact time between an immersion liquid and a device for a device illuminated in a dry lithography process and contacted with the immersion liquid prior and/or after the illumination and a means for deriving based thereon an immersion lithography process characteristic for the immersion lithography process. An exemplary processing system 400 is shown in FIG. 6. FIG. 6 shows one configuration of processing system 400 that includes at least one programmable processor 403 coupled to a memory subsystem 405 that includes at least one form of memory, e.g., RAM, ROM, and so forth. A storage subsystem 407 may be included that has at least one disk drive and/or CD-ROM drive and/or DVD drive. In some implementations, a display system, a keyboard, and a pointing device may be included as part of a user interface subsystem 409 to provide for a user to manually input information. Ports for inputting and outputting data also may be included. More elements such as network connections, interfaces to various devices, and so forth, may be included, but are not illustrated in FIG. 6. The various elements of the processing system 400 may be coupled in various ways, including via a bus subsystem 413 shown in FIG. 6 for simplicity as a single bus, but will be understood to those in the art to include a system of at least one bus. The memory of the memory subsystem 405 may at some time hold part or all (in either case shown as 411) of a set of instructions that when executed on the processing system 400 implement the step(s) of the method embodiments described herein. Thus, while a processing system 400 such as shown in FIG. 6 is prior art, a system that includes the instructions to implement aspects of the present invention is not prior art, and therefore FIG. 6 is not labelled as prior art.

It is to be noted that the processor 403 or processors may be a general purpose, or a special purpose processor, and may be for inclusion in a device, e.g., a chip that has other components that perform other functions. Thus, one or more aspects of the present invention can be implemented in digital electronic circuitry, or in computer hardware, firmware, software, or in combinations of them. Furthermore, aspects of the invention can be implemented in a computer program product tangibly embodied in a carrier medium carrying machine-readable code for execution by a programmable processor. Method steps of aspects of the invention may be performed by a programmable processor executing instructions to perform functions of those aspects of the invention, e.g., by operating on input data and generating output data. Accordingly, the present invention includes a computer program product which provides the functionality of any of the methods according to the present invention when executed on a computing device. Further, the present invention includes a data carrier such as for example a DVD, CD-ROM or a diskette which stores the computer product in a machine-readable form and which executes at least one of the methods of the invention when executed on a computing device. Nowadays, such software is often offered on the Internet or a company Intranet for download, hence the present invention includes transmitting the computer product according to the present invention over a local or wide area network.

The advantages of some methods and systems according to the present invention will be further illustrated by way of examples. It is to be noticed that the methods and systems of the present invention are not limited thereto.

Figure 7A:
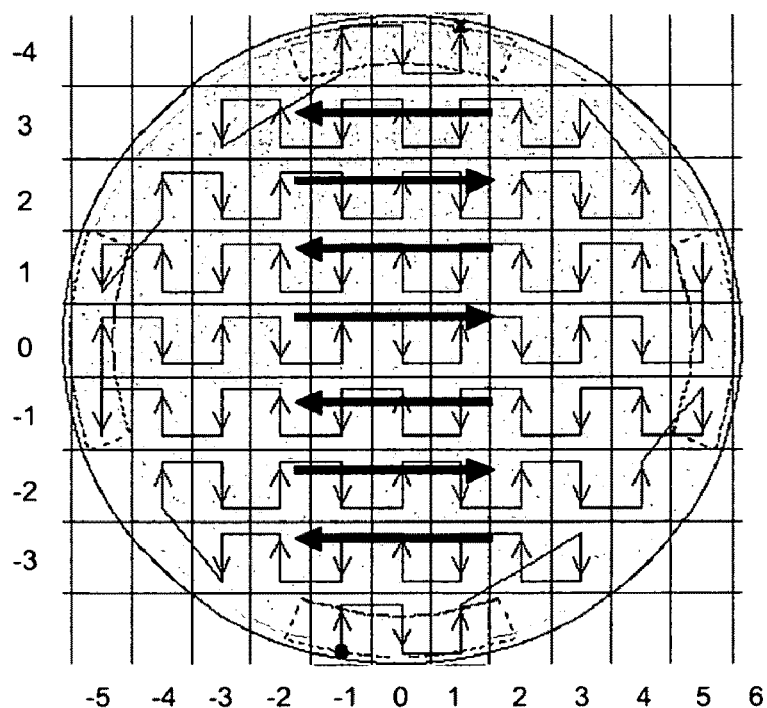
FIG. 7a to FIG. 7d illustrates a schematic view of an exposure sequence (FIG. 7a), a total soak time distribution (FIG. 7b), a pre-soak time distribution (FIG. 7c) and a post-soak time distribution (FIG. 7d) for immersion lithographic processing as may occur and characterised in embodiments of the present invention.
Figure 7B:
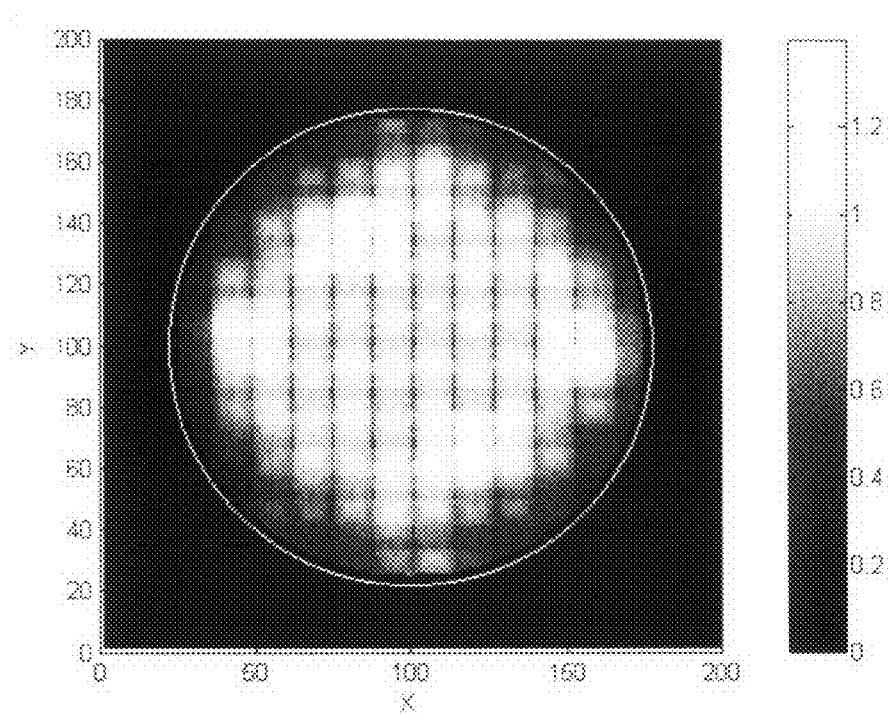
Figure 7C:
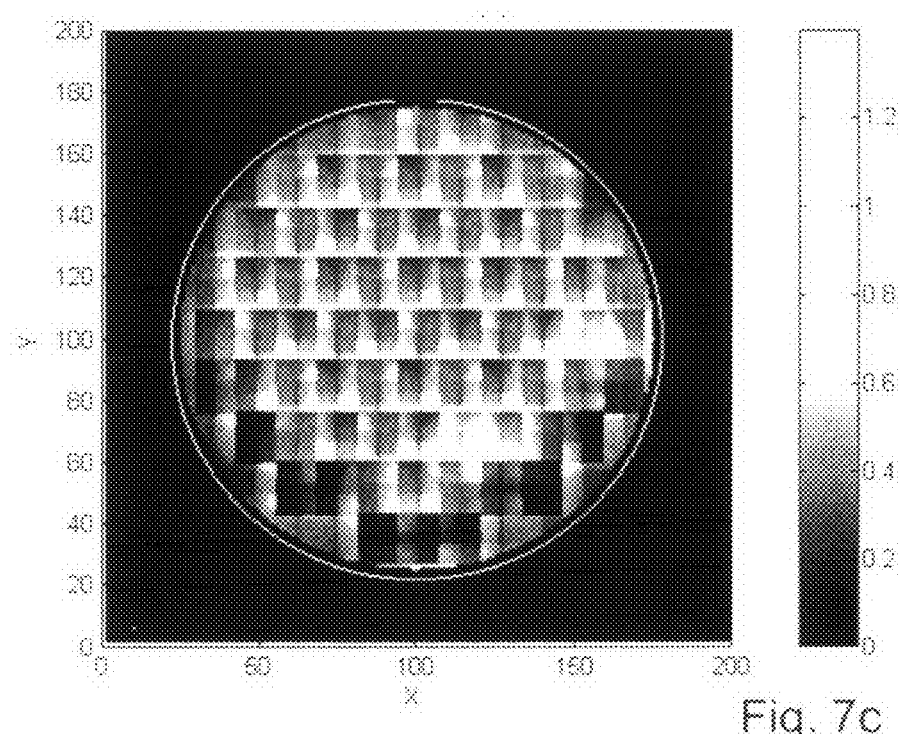
Figure 7D:
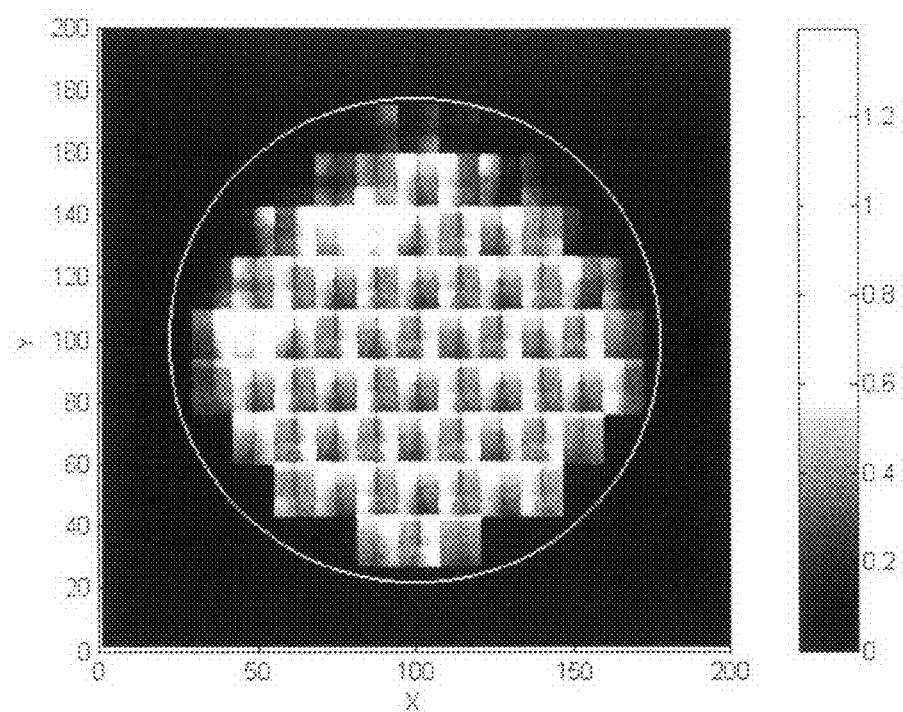
Figure 8:
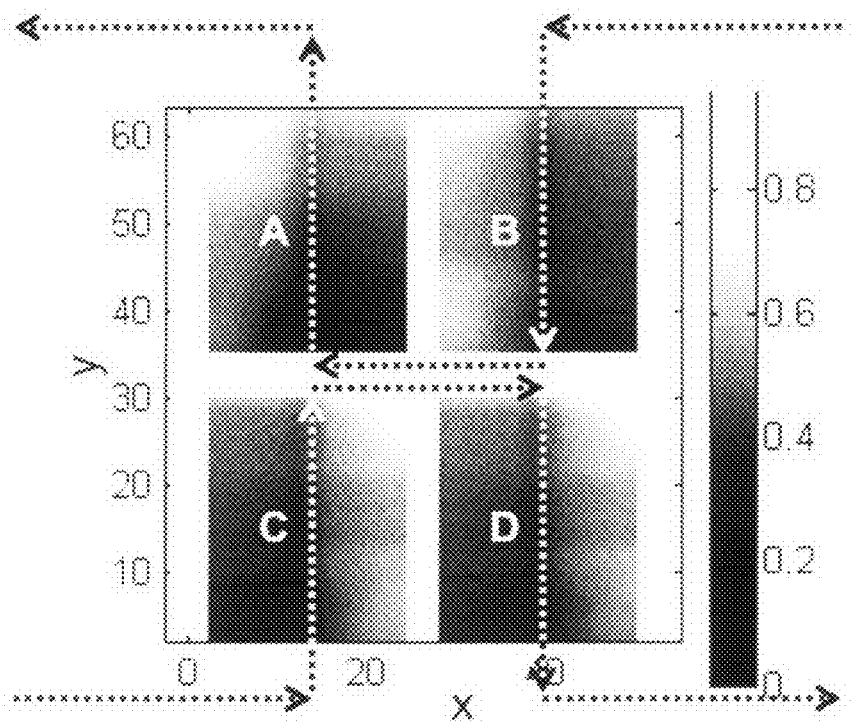
FIG. 8 illustrates an average intra-field soak fingerprint as function of the relative XY movements of the immersion showerhead and the device, as may occur and characterised in embodiments of the present invention.
Figure 9:
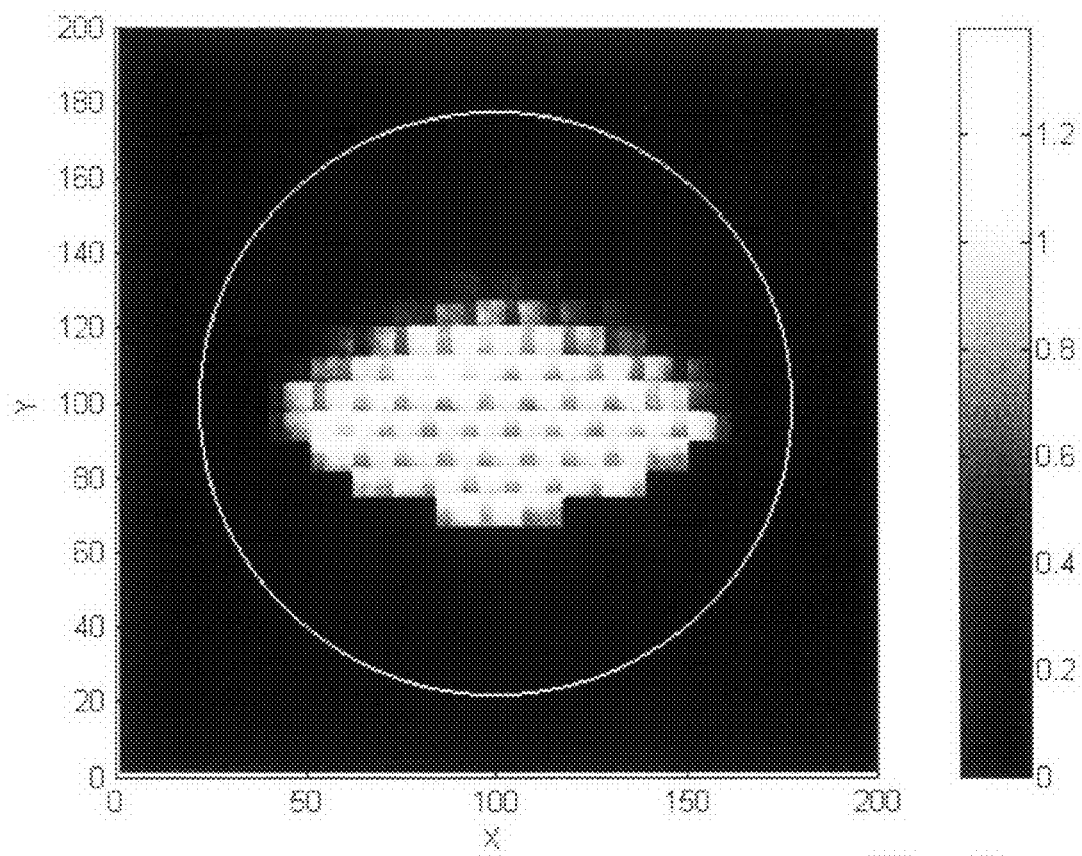
FIG. 9 illustrates a post-soak time distribution for a wafer exposure using a smaller printing field compared to the distribution shown in FIG. 7d.

In a first example, soak time variations over a device for a given scanner exposure step are illustrated, showing the presence of different pre-soak and post-soak time behaviour over a device during immersion lithographic processing, which may be studied using embodiments of the present invention. An illustration is provided of the exposure sequence and the resulting total soak time distribution, the pre-soak time distribution and the post-soak time distribution for a plurality of fields to be printed. In FIG. 7a to FIG. 7d, the example of an exposure of 71 fields of 26 mm by 33 mm size on a 300 mm wafer is illustrated. FIG. 7a shows a possible exposure sequence, in the present example being a default exposure sequence of a Twinscan ASML scanner as obtainable from ASML Corporation. It can be seen that in the present example the printing typically is performed row per row, starting from the lower left position and alternating the scanning directions for the subsequent exposures. During the exposure described in the present example, the stage typically moves at a constant velocity with respect to the showerhead. In between the exposures, the stage makes a U turn, thus providing relative variations in X-velocity and Y-velocity for the showerhead of the lithographic system. The soak time calculations are determined based on the provided exposure sequence and the velocity during exposure, typically selected as function of the required exposure dose, and dimensional properties of the showerhead, e.g. the showerhead diameter. FIG. 7b shows the calculated total soak time for an exposure with an exposure path as shown in FIG. 7a. Variations of the total soak time can be seen, with an average soak time for the central part of the device of about 1.1 s. For edge dies the soak time is less, since the showerhead is passing less over that region, as less neighbouring dies are present. As the chemical interactions in pre-soak can be different to those in post-soak, the distribution of pre- and post-soak are visualized separately in FIG. 7c respectively FIG. 7d, corresponding again to the exposure path shown in FIG. 7a. It can be seen that in the interior of the wafer, the soak time shows a larger intra-field fingerprint, which can be different from field to field. While the overall total soak time was about 1.1 s, for pre- and post-soak the intra-field soak times vary in between 0.2 s to 0.8 s, which is a significant variation. For edge dies a lower pre-soak time and post-soak time can be seen compared to centrally positioned dies, whereby the discrepancy in soak time is mainly present on edge dies in the lower substrate half for the pre-soak case, while the edge dies in the upper wafer half are more affected for the post-soak case. The latter illustrates that different soak times typically occur over the device and even within an exposure field of a scanner system. The latter can be explained by the particular relative XY movements between the substrate and the showerhead, which can be different from field to field. This is illustrated in FIG. 8 where, as an example, the post-soak time for interior dies is averaged in four groups according to the scan direction of that field and according to the overall direction the showerhead is moving when it is exposing a row in the device layout. This again confirms the significant intra-field variation of the post-soak time. It can be seen that the extreme intra-field soak time and the signature are clearly field dependent, due to the differences in X-Y movements. This indicates that for interior fields variation, the interaction can be described using the four characteristic soak quadrants shown in FIG. 8. Applying the same printing sequence for a printing field of about half the size results in a significant impact on the soak time distribution over the device, as can be seen in FIG. 9. It can be seen that the maximum post-soak time is now increased to the order of 2 s. Since the edge dies of the upper wafer half still have post-soak times in the order of 0.3 s, across wafer soak time variation will certainly increase for smaller printing fields, but most of this increase will be present in the device edge region. The characteristic intra-field soak fingerprint is still present but its shape is modified due to the relative changes in exposure movements. For post-soak, time variations of about 0.5 s can be seen. For interior dies, the magnitude of the intra-field soak time variations seems comparable to these of the full field case and the main effect is an over-all higher average value. From these experiments it can be seen that the soak of the wafer in an immersion scanner is local, i.e. defined by the showerhead area and dynamic, since continuously the wafer is in movement relative to the lens for exposing the different fields on a wafer. Due to this local and dynamic behavior, during the printing of fields on a wafer, some parts of the device will have more interaction time (i.e. more soak), than others. As suggested also previously, other physical or chemical interactions might occur either before or after exposure. Therefore, taking into account both pre-soak and post-soak may be advantageous.

Figure 10:
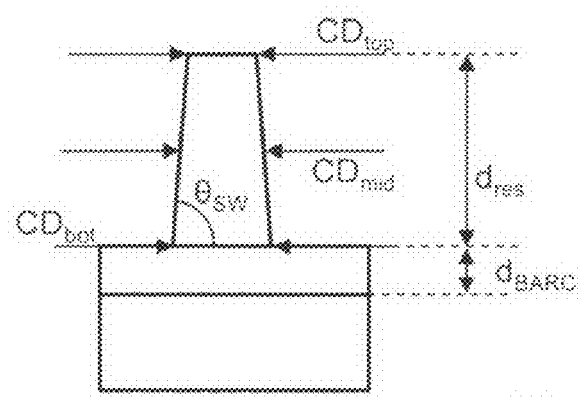
FIG. 10 illustrates parameters related to critical dimension of a feature according to a model as used for evaluating critical dimension in an example image performance characteristic determination for illustrating advantages of embodiments according to the present invention.
Figure 11A:
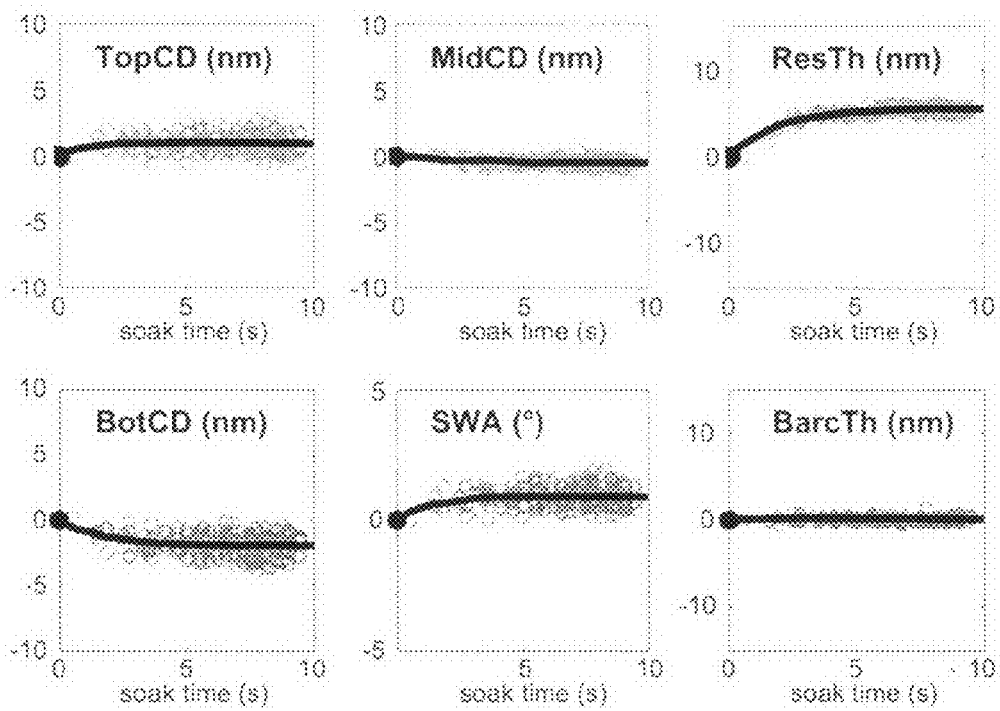
FIG. 11a to FIG. 12b illustrate CD parameter variations as function of pre-soak (FIG. 11a and FIG. 12a) and post-soak (FIG. 11b and FIG. 12b) time for a device without top coating layer (FIG. 11a and FIG. 11b) and a device with top coating layer (FIG. 12a and FIG. 12b) as obtained in a virtual immersion lithography process, illustrating advantages of embodiments according to the present invention.
Figure 11B:
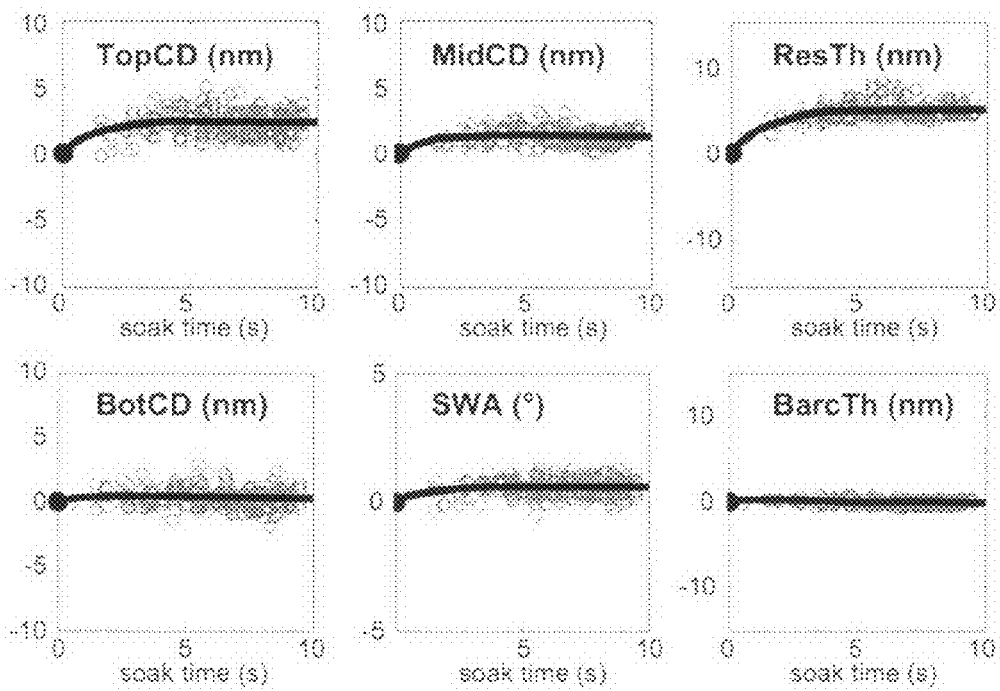

The following example shows an illustration of a characterisation of an immersion lithography process using a virtual immersion process. The method for determining at least one image performance characteristic is in the present example performed on a 200 mm litho set-up, consisting of an ASML PAS5500/1100 for dry 193 nm exposure, interfaced with a TEL ACT8 Clean Track. The rinse nozzle of the TEL ACT8 Clean Track system is used for performing a pres-soak and post-soak contacting step in a development cup. A standard resist for advanced 193 nm gate technology is used, allowing good performance on a real immersion scanner without significant impact on profile as inspected in CD-SEM and cross-section SEM. Devices comprising a resist layer of 150 nm on a standard bottom anti-reflective coating (BARC) and with or without commercial top coating layer that is developer soluble are tested. The target structure is a 90 nm dense (1:1 line/space) grating. Exposure is done using a binary reticle in combination with 0.75NA and $\sigma_i/\sigma_o=0.89/0.59$ annular settings. Scatterometry is chosen to characterize CD-variations as image performance characteristic, using both a KLA-Tencor F5 system and a TEL iODP system. A simple trapezoid model providing a lot of two-dimensional information is used to describe CD-related parameters. The obtainable parameters are CD at the top surface of the resist ($CD_{top}$), CD at the bottom surface of the resist ($CD_{bottom}$), CD at half the resist height ($CD_{mid}$), side-wall angle ($\theta_{SW}$), resist thickness ($d_{res}$), and BARC thickness ($d_{BARC}$), as illustrated in FIG. 10. Dynamic repeatability tests (not shown) for measurements of these parameters for lithography without soak and lithography with post-soak learn that the same parameters may be used in both cases. FIG. 11a and FIG. 11b illustrate the CD parameters for a pre-soaked device respectively a post-soaked device for a device without top coat. For pre-soak effects, shown in FIG. 11a, only a small variation is seen in the side-wall angle of the resist profile, resulting in a weak change in the critical dimension at the bottom surface of the resist and the critical dimension at the top surface of the resist, derived there from. Even for several seconds of soak time, these changes are small, i.e. approximately within one nanometer. The most significant response from pre-soak is directed to the resist thickness, where the profile gains about 5 nm in height in the first 5 s of pre-soak time. For post-soak, a more significant response is found in the CD-parameters, as is illustrated in FIG. 11b. The largest effect is measured in the critical dimension at the top of the resist layer, where slightly more than 2 nm increase was found in the first seconds of post-soak. This could be due to acid leaching out the top part of the resist. Besides CD at the top of the resist layer, an increase in resist thickness is also observed, similar to that seen in the pre-soak. From these experiments it can e.g. be derived that the resist used shows little CD and profile changes in an immersion lithography process. A small fingerprint may be present from the post-soak.

Figure 12A:
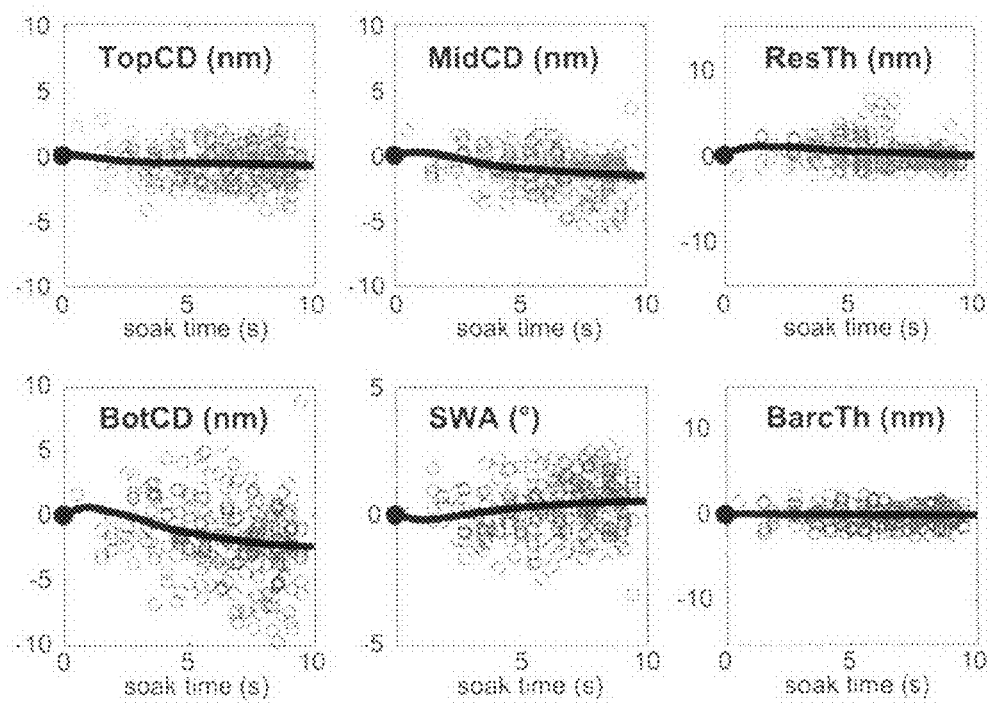
Figure 12B:
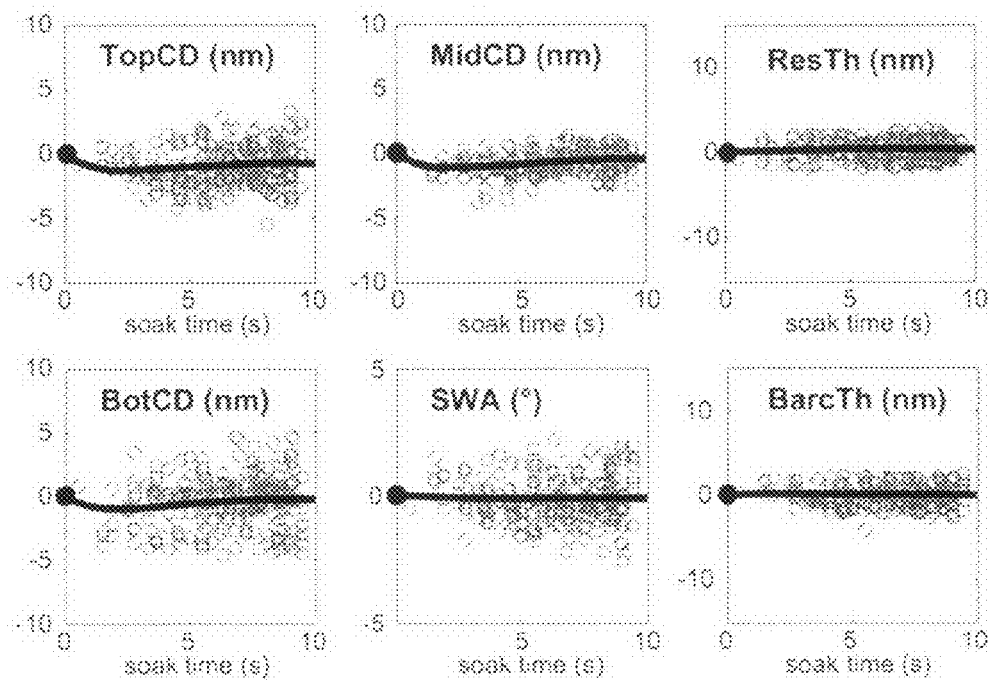

Similar experiments are performed for a device comprising a top coating, the results being illustrated in FIG. 12a for pre-soak and FIG. 12b for post-soak. Compared to the previously described case without a topcoat, more noise is present on the response curves, which may be due to the manual application of the top coating, leading to small variations. For pre-soak, no significant changes can be seen in CD-response hinting that applying a top coat may provide a good leaching barrier for events occurring before the exposure. Although the CD-response is low in post-soak as well, a weak but significant CD-decrease is detected in e.g. MidCD and TopCD, as is illustrated in FIG. 12b. In contrast to the 'no topcoat' case, no change is seen in the resist thickness as function of changing soak time. It can be seen that for the situation with top coat an increase in soak time results in a decrease of CD, while in the 'no topcoat' case, the CD increases with soak time. Based on this investigation, we could already conclude that the combination of the resist and the top coating shows limited CD and profile changes in an immersion scanner. A fingerprint may be present from the post-soak.

Figure 13A:
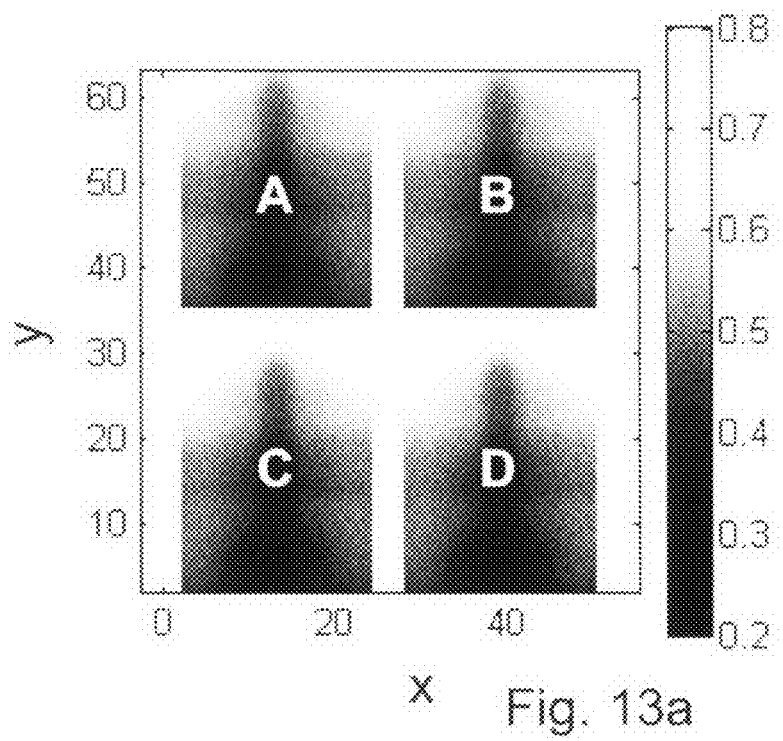
FIG. 13a and FIG. 13b illustrate $CD_{Mid}$ parameter variations as function of post soak time for the average intra-field (FIG. 13a) and the residual intra-field (FIG. 13b) for the different soak quadrants, resulting from applying an immersion lithography process illustrating advantages of embodiments according to the present invention.
Figure 13B:
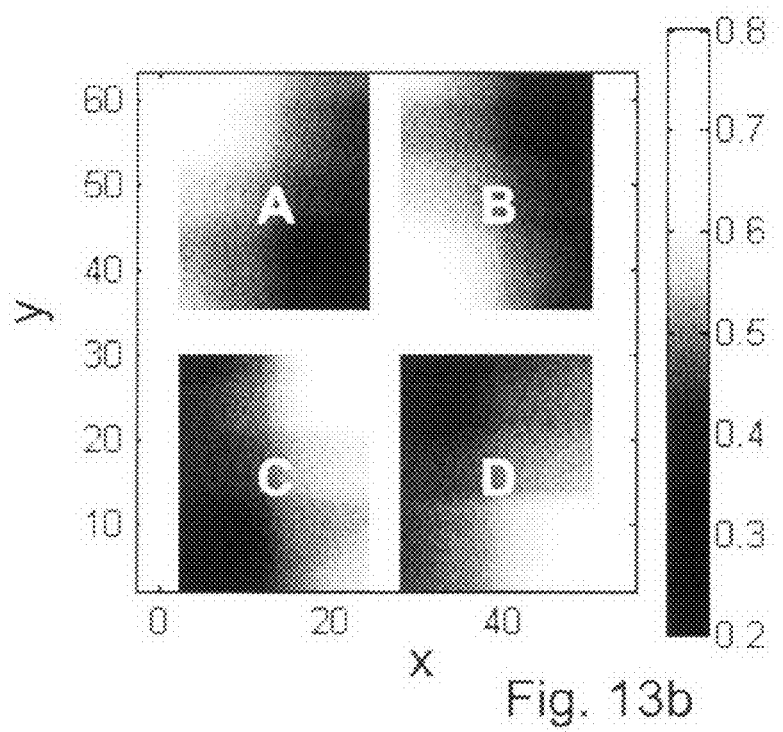
Figure 14A:
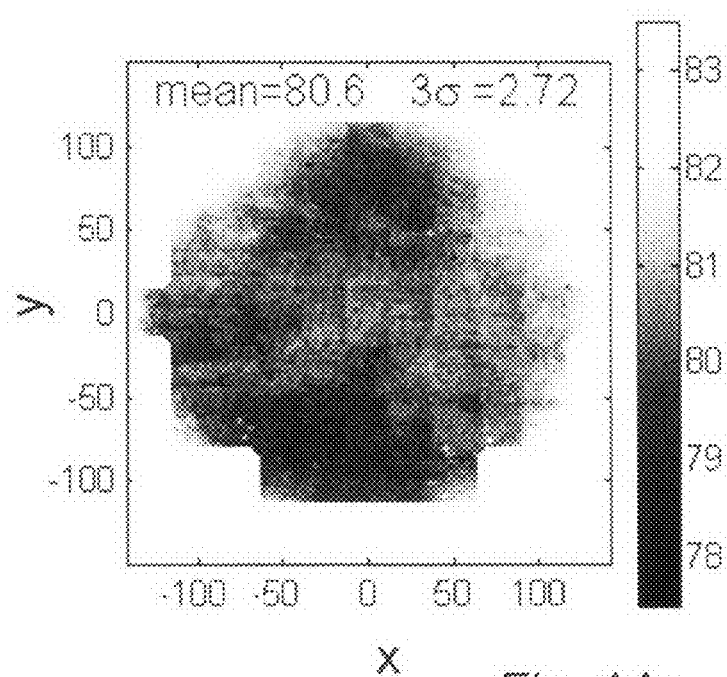
FIG. 14a to FIG. 14c illustrate $CD_{Mid}$ parameter variations as function of post soak time for the full wafer print field as measured with an immersion lithographic system (FIG. 14a), the corresponding average field in the different soak quadrants (FIG. 14b) and a correlation graph between the average field in the different soak quadrants and the simulated soak time results (FIG. 14c) for a device with a first top coating, illustrating advantages of embodiments according to the present invention.
Figure 14B:
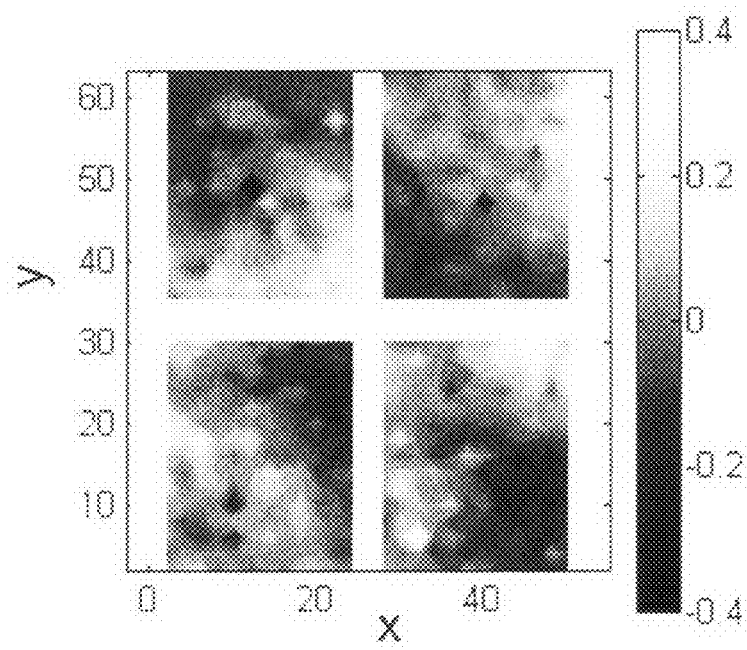
Figure 14C:
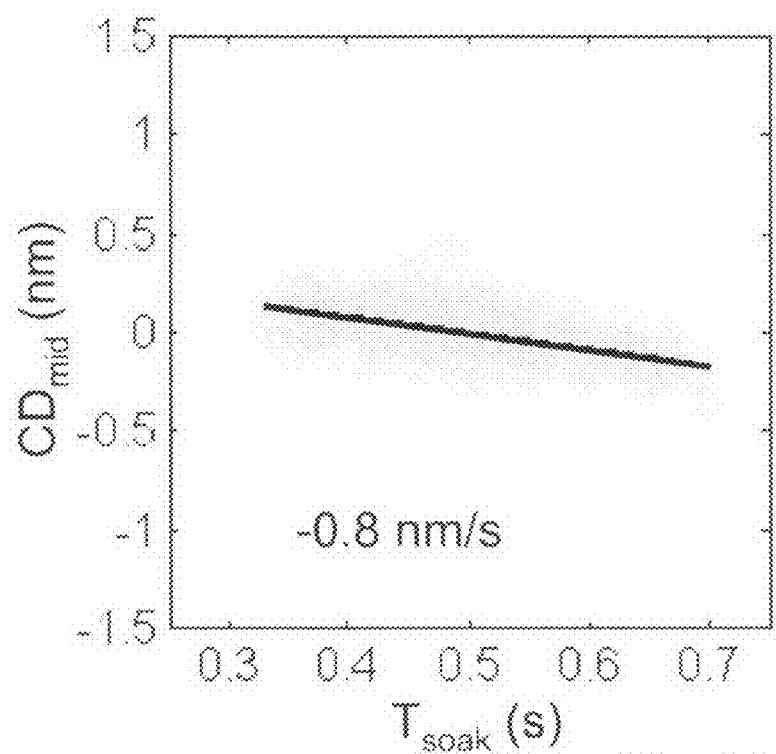

In order to illustrate the effectiveness of the use of a virtual immersion lithography process to mimic a real immersion lithography process, the obtained results for critical dimension uniformity (CDU) analysis are compared with results obtained with an ASML XT:1250Di immersion scanner. In these verification tests, process conditions of the resist and illumination settings on the scanner were identical to those used with the virtual immersion set-up and the same exposure sequence was used. The CDU reticle was again a 12×15 identical 90 nm L/S feature grating, distributed uniformly over the 26 mm×33 mm exposure field. The critical dimension analysis was performed on averaged fields having the same relative movement of showerhead with respect to the wafer, as also discussed for FIG. 8, to reveal the CD-variations related to soak only. The average intra-field CD-fingerprint was subtracted from the raw data to obtain the characteristic quadrants of the experimental CDU devices with soak time data. The latter also was applied to the results of the simulated soak time for the obtained results from the virtual set-up, i.e. the results obtained in FIG. 11a, FIG. 11b and FIG. 12a, FIG. 12b. In order to remove the common intra-field component from the characteristic quadrants shown in FIG. 8, the field specific soak time is decomposed an average intra-field component and a remaining intra-field residual, which is soak quadrant specific, as shown in FIG. 13a and FIG. 13b respectively. It is the soak time residual shown in FIG. 13b that is compared with the data obtained in the real immersion lithography process. CD uniformity verification results, i.e. measured on a real immersion lithography system, for a device having a resist with a top coat as described above are shown in FIG. 14a to FIG. 14c. FIG. 14a illustrates raw data of full wafer uniformity of the critical dimension at half the resist height wherein the over-all intra-field fingerprint is removed. Nevertheless, no clear soak related fingerprint can be seen. When averaged towards the characteristic soak quadrants, a soak related impact can be seen as shown in FIG. 14b. Correlating the obtained results of FIG. 14b with the simulated soak time results shown in FIG. 13b illustrates that a weak impact is present, as shown in the correlation plot shown in FIG. 14c. The sensitivity of the critical dimension at half resist height parameter to soak time calculated from this plot was −0.8 nm/s, which is in good agreement with the results obtained for the virtual immersion setup as shown in FIG. 12a and FIG. 12b, both in sign and magnitude.

Figure 15A:
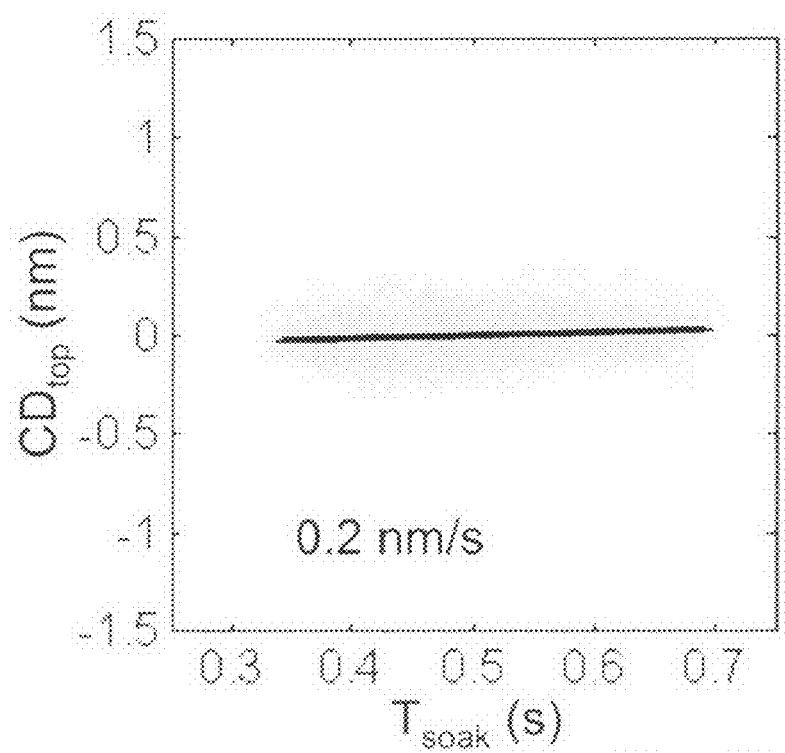
FIG. 15a to FIG. 15b illustrate the a correlation graph between the average field in the different soak quadrants obtained using immersion lithographic processing and the simulated soak time results for a device without top coating for the CD at the top surface of the resist (FIG. 15a) and for the resist thickness FIG. 15b, illustrating advantages of embodiments according to the present invention.
Figure 15B:
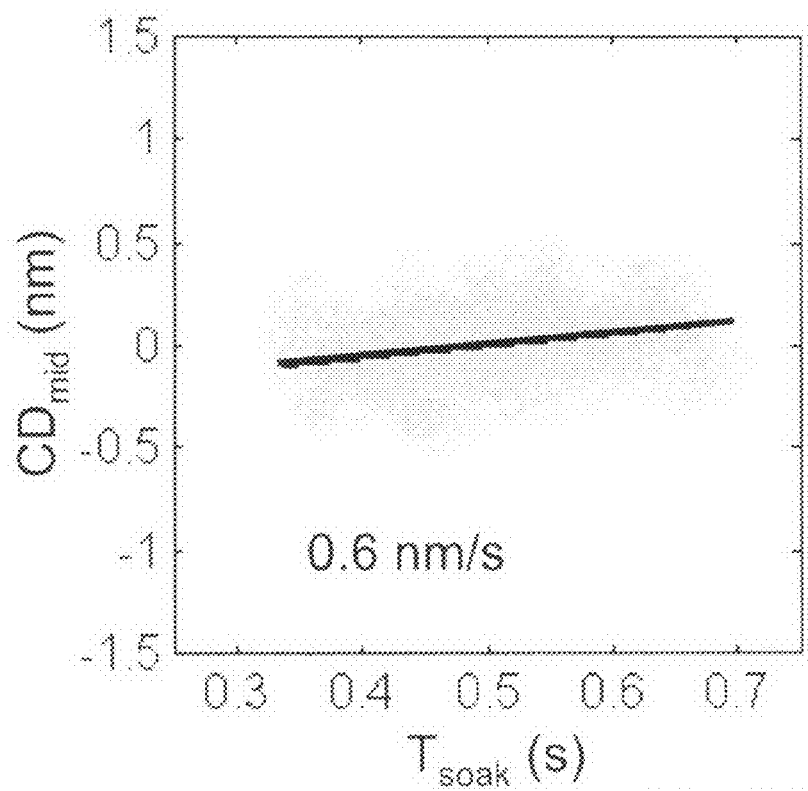

CD uniformity verification results, measured on a real immersion lithography system, for a device having a resist but without top coat as described above are shown in FIG. 15a to FIG. 15b. The full wafer uniformity raw data (not shown) do not indicate a soak related fingerprint but averaging the data towards the characteristic soak quadrants and correlating this data with simulated soak time distributions reveals a soak related effect as can be seen in FIG. 15a for the critical dimension at the top side of the resist and in FIG. 15b for the resist thickness parameter. The correlation plot of FIG. 15a shows that the sensitivity of the CD at the top side of the resist parameter to soak time (0.2 nm/s) is lower than for a device with top coating and that its sign is opposite. The latter is in agreement with the observations obtained in the virtual immersion experiments, shown in FIG. 11a and FIG. 11b. The trend in resist thickness/soak time fingerprint, of which the correlation plot is shown in FIG. 15b, is qualitatively in line with the virtual immersion experiments.

The above example illustrate that soak related CD variations exist and that, although the effects are small, they are in line with the soak time simulations and the CD-response obtained on a virtual immersion set-up. The latter thus illustrates the advantageous of the described methods and systems. The methods also could be useful for selecting materials for lithography processes and to set specifications for allowed CD-variations in line with to the over-all allowed CD-budget.

Figure 16A:
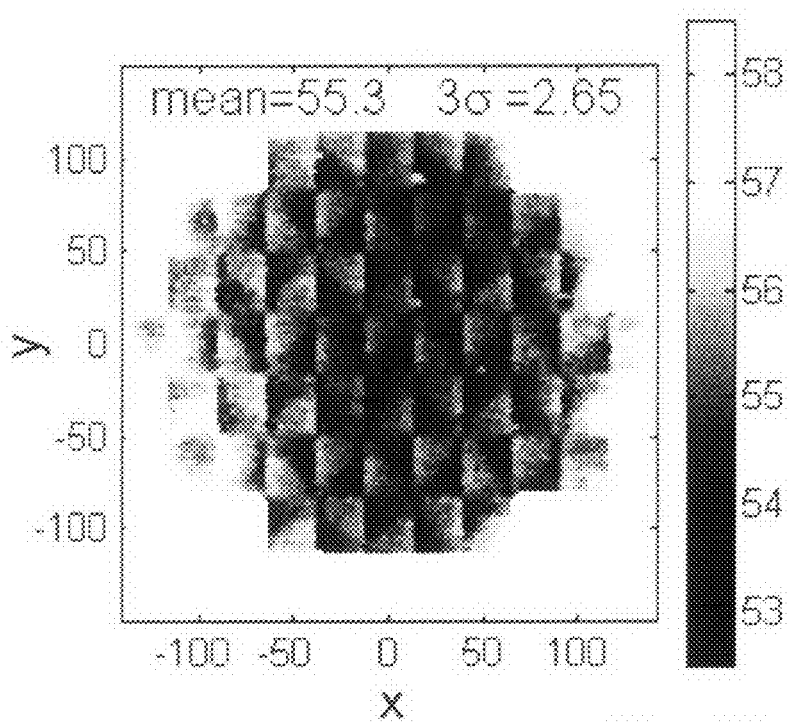
FIG. 16a to FIG. 16c illustrate the full wafer print field as measured with an immersion lithographic system (FIG. 16a), the corresponding average field in the different soak quadrants (FIG. 16b) and a correlation graph between the average field in the different soak quadrants and the simulated soak time results (FIG. 16c) for a device with a first top coating, illustrating advantages of embodiments according to the present invention.
Figure 16B:
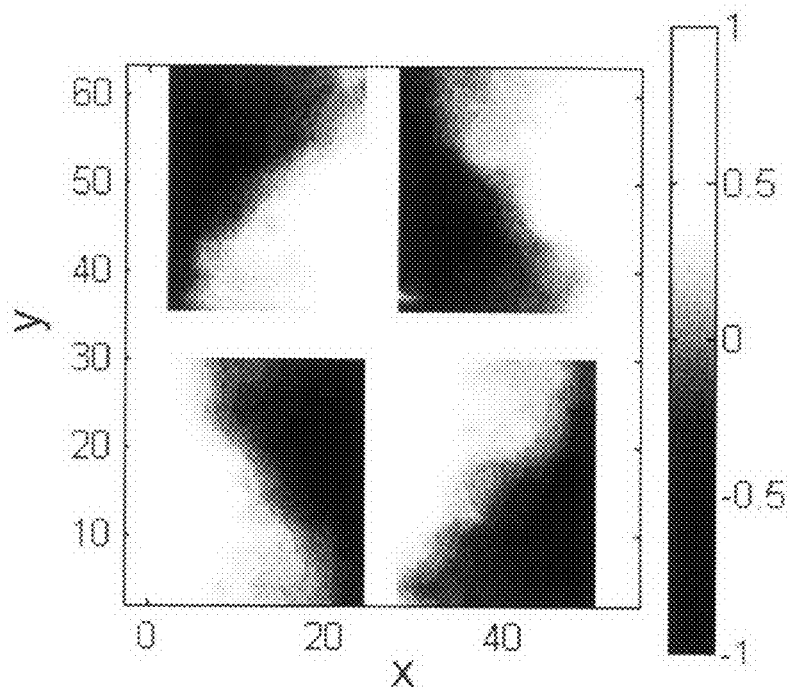
Figure 16C:
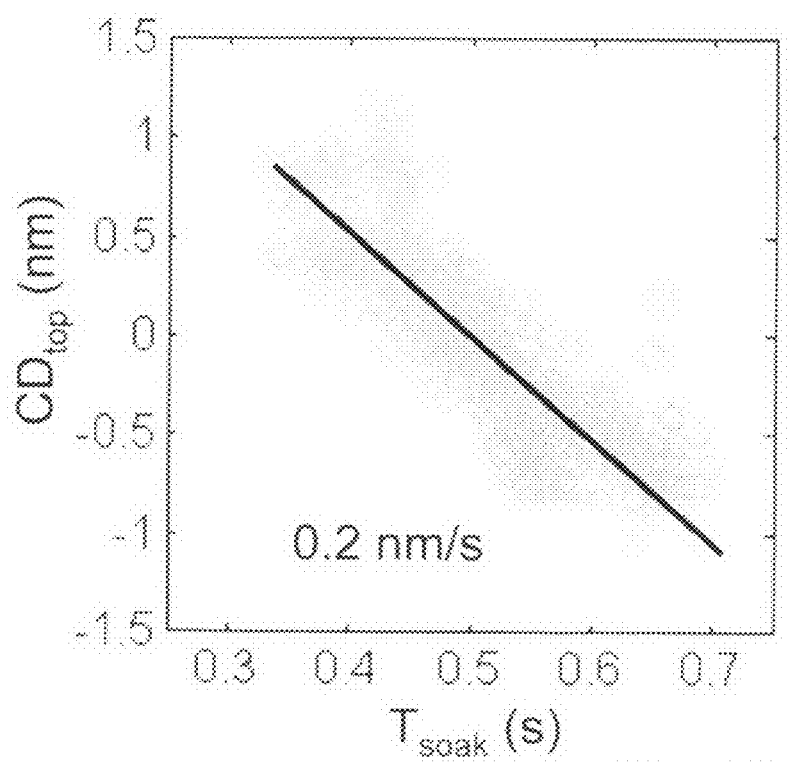

In another example, results are shown for immersion lithographic processing of a device with a resist layer and another type of top coating. Results are obtained using the same illumination settings and reticle as described in the previous example. It reveals a soak related fingerprint on the device, after the intra-field average was removed. This is illustrated in FIG. 16a to FIG. 16c, whereby in FIG. 16a the full wafer uniformity is shown for the obtained CD at half the height of the resist layer, giving a similar across-wafer behavior as the post-soak time distribution as shown in FIG. 7d. When the CD at half the height of the resist layer is averaged according to their characteristic soak quadrants, then the effect is becoming even more apparent, as is illustrated in FIG. 16b. Moreover, in FIG. 16c this soak quadrant data is put in a correlation plot resulting in a value for CD-response—around 5 nm/s. The latter illustrates a soak related CD variation and illustrates the validity of the soak time simulation illustrated in the first example.

It is an advantage of embodiments of the present invention that a methodology is provided for understanding and quantifying the impact of soak on image performance characteristics, such as e.g. the CD control or resist profile control. The latter is obtained by quantifying experimentally how much image performance variation is caused by a particular pre- and post-soak time, by testing the process in a virtual immersion set-up or process and measuring the image performance variation. In this way, lithographic processing characteristics such as e.g. CD-variations related to immersion soak can be derived.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. A method for characterising an immersion lithographic processing of a device using an immersion liquid, the immersion lithographic processing comprising exposing said device to an immersion liquid, the method comprising:
   determining at least one image performance characteristic as function of contact times between said immersion liquid and a device for a device illuminated in a dry lithography process and contacted with said immersion liquid prior and/or after said illumination, and
   deriving a lithography process characteristic for said immersion lithographic processing based on said at least one determined image performance characteristic.

2. A method according to claim 1, wherein said determining at least one image performance characteristic as function of contact times comprises:
   determining dimensional variations in an image performance characteristic as function of contact times.

3. A method according to claim 1, wherein said determining at least one image performance characteristic for the device contacted with said immersion liquid comprises:
   determining at least one image performance characteristic as function of contact times for a device contacted with said immersion liquid by dispensing said immersion liquid over said device in an at least partially radial dispensing movement for providing a varying contact time between said immersion liquid and said device varying radially over said device.

4. A method according to claim 3, wherein said device is spun during said dispensing, thus creating centrifugal forces that systematically remove said immersion liquid from said device.

5. A method according to claim 3 wherein an at least partially radial dispensing movement is an inwardly at least partially radial dispensing movement.

6. A method according to claim 1, wherein said determining at least one image performance characteristic as function of contact times comprises determining an image parameter for a printed structure of said device, printed during said illumination in said dry lithography process.

7. A method according to claim 6, said printed structure being printed on at least a radial part of said device, wherein said determining image parameter for a printed structure comprises determining said image parameter for a printed structure at different radial positions of said device.

8. A method for according to claim 1, wherein said determining at least one image performance characteristic for a device contacted with said immersion liquid prior and/or after said illumination, comprises determining a first image performance characteristic as a function of first contact times for a device contacted with said immersion liquid prior to said illumination and determining a second image performance characteristic as a function of second contact times for a device contacted with said immersion liquid after said illumination.

9. A method according to claim 8, the method furthermore comprising:
   determining first exposure time periods during which, for an immersion lithography process, said device is exposed to said immersion liquid before illumination and determining second exposure time periods during which, for an immersion lithography process, said device is exposed to said immersion liquid after illumination;
   wherein deriving a lithography process characteristic for said immersion lithography process comprises determining an image performance characteristic of said immersion lithography process based on correlating said first and second exposure time periods to said first and second image performance characteristics.

10. A method according to claim 1, wherein deriving said lithography process characteristic comprises deriving whether an obtained image for said immersion lithography process is allowable or not.

11. A method for characterising an immersion lithography process of a device using an immersion liquid, the immersion lithography process comprising exposing said device to an immersion liquid, the method comprising:
   illuminating said device in a dry lithography process, and
   contacting said device with said immersion liquid prior to and/or after said illuminating, said contacting a device with said immersion liquid by dispensing said immersion liquid over said device in an at least partially radial dispensing movement for providing a varying contact time between said immersion liquid and said device varying radially over said device.

12. A method for immersion lithography processing of a device, the method comprising contacting said device with an immersion liquid, wherein the influence of contacting the device with an immersion liquid on the immersion lithography process has been characterised using a method according to claim 1.

13. An apparatus for use in a method according to claim 1, the apparatus adapted for controllably contacting a device with immersion liquid, the apparatus comprising
- a means for rotating a device
- a means for dispensing adapted for dispensing said immersion liquid over said device in an at least partially radial movement with a controlled radial velocity.

14. A computing system, the system comprising
- a means for receiving values for at least one image performance characteristic as function of contact times between said immersion liquid and a device for a device illuminated in a dry lithography process and contacted with said immersion liquid prior and/or after said illumination, and
- a means for deriving a lithography process characteristic for said immersion lithography process based on said values for an image performance characteristic.

15. A machine readable data storage device storing executable instructions for a method of characterising an immersion lithographic processing of a device using an immersion liquid, the instructions being instructions to perform steps comprising:
- determining at least one image performance characteristic as function of contact times between said immersion liquid and a device for a device illuminated in a dry lithography process and contacted with said immersion liquid prior and/or after said illumination, and
- deriving a lithography process characteristic for said immersion lithographic processing based on said at least one determined image performance characteristic.

16. A method comprising transmitting, over a local or wide area telecommunications network, the executable instructions recited in claim 15.

* * * * *